(12) United States Patent
Takemura

(10) Patent No.: US 9,142,320 B2
(45) Date of Patent: Sep. 22, 2015

(54) MEMORY ELEMENT AND SIGNAL PROCESSING CIRCUIT

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 520 days.

(21) Appl. No.: 13/440,227

(22) Filed: Apr. 5, 2012

(65) Prior Publication Data

US 2012/0257440 A1 Oct. 11, 2012

(30) Foreign Application Priority Data

Apr. 8, 2011 (JP) ................................ 2011-085995

(51) Int. Cl.
| | |
|---|---|
| *G11C 11/412* | (2006.01) |
| *G11C 27/02* | (2006.01) |
| *G11C 11/41* | (2006.01) |
| *G11C 11/24* | (2006.01) |
| *G11C 5/10* | (2006.01) |

(52) U.S. Cl.
CPC ............. *G11C 27/024* (2013.01); *G11C 5/10* (2013.01); *G11C 11/24* (2013.01); *G11C 11/41* (2013.01); *G11C 11/412* (2013.01)

(58) Field of Classification Search
CPC .... G11C 27/024; G11C 11/412; G11C 11/41; G11C 5/10; G11C 11/24
USPC ......... 365/149, 154, 156, 188, 189.2; 345/80, 345/90, 92, 98
See application file for complete search history.

(56) References Cited

U.S. PATENT DOCUMENTS

| | | | |
|---|---|---|---|
| 4,762,398 A | * | 8/1988 | Yasui et al. ..................... 349/43 |
| 5,731,856 A | | 3/1998 | Kim et al. |
| 5,744,864 A | | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — J. H. Hur
(74) *Attorney, Agent, or Firm* — Fish & Richardson P.C.

(57) ABSTRACT

An object is to provide a memory device for which a complex manufacturing process is not necessary and whose power consumption can be suppressed, and a signal processing circuit including the memory device. In a memory element including a phase-inversion element such as an inverter or a clocked inverter, a capacitor which holds data and a switching element which controls storing and releasing of electric charge in the capacitor are provided. For the above switching element, a transistor including amorphous silicon, polysilicon, microcrystalline silicon, or a compound semiconductor such as an oxide semiconductor in a channel formation region is used. The channel length of the transistor is ten times or more as large as the minimum feature size or greater than or equal to 1 μm. The above memory element is used for a memory device such as a register or a cache memory in the signal processing circuit.

24 Claims, 9 Drawing Sheets

(56) References Cited

U.S. PATENT DOCUMENTS

| | | | |
|---|---|---|---|
| 6,066,524 A * | 5/2000 | Park | 438/238 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,723,721 B2 | 5/2010 | Udagawa et al. | |
| 7,732,819 B2 | 6/2010 | Akimoto et al. | |
| 7,772,053 B2 | 8/2010 | Kameshiro et al. | |
| 2001/0046027 A1 | 11/2001 | Tai et al. | |
| 2002/0056838 A1 | 5/2002 | Ogawa | |
| 2002/0060660 A1 * | 5/2002 | Yamasaki | 345/98 |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045397 A1 * | 2/2009 | Iwasaki | 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0176357 A1 | 7/2011 | Koyama et al. | |
| 2011/0187410 A1 | 8/2011 | Kato et al. | |
| 2011/0193078 A1 | 8/2011 | Takemura | |
| 2012/0032730 A1 | 2/2012 | Koyama | |
| 2012/0294069 A1 | 11/2012 | Ohmaru et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of TEchnical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTS and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Sasoka.Y et al., "29.1:Polarizer-Free Refelective LCD Combined With Ultra Low-Power Driving Technology", SID Digest'09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.

(56) References Cited

OTHER PUBLICATIONS

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B.(Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

MEMORY ELEMENT AND SIGNAL PROCESSING CIRCUIT

BACKGROUND OF THE INVENTION

1. Field of the Invention

The present invention relates to a memory element including a semiconductor device and a signal processing circuit including a semiconductor device.

2. Description of the Related Art

Transistors using amorphous silicon, polysilicon, microcrystalline silicon, or the like have been used for display devices such as liquid crystal displays conventionally. Nowadays, a technique in which such transistors are utilized for semiconductor integrated circuits is proposed (e.g., see Patent Document 1).

In recent years, a metal oxide having semiconductor characteristics, which is called an oxide semiconductor, has attracted attention as a novel semiconductor material having high mobility equivalent to that of polysilicon or microcrystalline silicon and having uniform element characteristics equivalent to those of amorphous silicon.

The metal oxide is used for a variety of applications. For example, indium oxide is a well-known metal oxide and used as a material of a transparent electrode included in a liquid crystal display device or the like. As metal oxides having semiconductor characteristics, for example, there are tungsten oxide, tin oxide, zinc oxide, and the like, and a transistor in which a channel formation region is formed using such a metal oxide having semiconductor characteristics has been known (see Patent Documents 2 to 4).

REFERENCE

[Patent Document 1] U.S. Pat. No. 7,772,053
[Patent Document 2] United States Published Patent Application No. 2007/0072439
[Patent Document 3] United States Patent Application Publication No. 2011/0193078
[Patent Document 4] United States Patent Application Publication No. 2011/0176357

SUMMARY OF THE INVENTION

A signal processing circuit such as a central processing unit (CPU) employs a variety of configurations depending on its application but is generally provided with various semiconductor memory devices (hereinafter, simply referred to as memory devices) such as a register and a cache memory as well as a main memory for storing data or a program.

A register has a function of temporarily holding data for carrying out arithmetic processing, holding a program execution state, or the like. In addition, a cache memory is provided in a CPU so as to be located between an arithmetic unit and a main memory in order to reduce low-speed access to the main memory and speed up the arithmetic processing.

In a memory device such as a register or a cache memory, writing of data needs to be performed at higher speed than operation in a main memory. Therefore, in general, a flip-flop circuit is used as a register and an SRAM or the like is used as a cache memory.

FIG. 2A illustrates a memory element which constitutes a register. A memory element 200 illustrated in FIG. 2A includes an inverter 201, an inverter 202, a switching element 203, and a switching element 204. Input of a signal IN to an input terminal of the inverter 201 is controlled by the switching element 203. A potential of an output terminal of the inverter 201 is supplied to a circuit of a subsequent stage as a signal OUT. The output terminal of the inverter 201 is connected to an input terminal of the inverter 202, and an output terminal of the inverter 202 is connected to the input terminal of the inverter 201 via the switching element 204.

When the switching element 203 is turned off and the switching element 204 is turned on, a potential of the signal IN which is input via the switching element 203 is held in the memory element 200.

A specific circuit configuration of the memory element 200 in FIG. 2A is illustrated in FIG. 2B. The memory element 200 illustrated in FIG. 2B includes the inverter 201, the inverter 202, the switching element 203, and the switching element 204, and the connection structure of these circuit elements is the same as that in FIG. 2A.

The inverter 201 includes a p-channel transistor 207 and an n-channel transistor 208 whose gate electrodes are connected to each other. In addition, the p-channel transistor 207 and the n-channel transistor 208 are connected in series between a node to which a high-level power supply potential VDD is supplied and a node to which a low-level power supply potential VSS is supplied.

In a similar manner, the inverter 202 includes a p-channel transistor 209 and an n-channel transistor 210 whose gate electrodes are connected to each other. In addition, the p-channel transistor 209 and the n-channel transistor 210 are connected in series between a node to which the high-level power supply potential VDD is supplied and a node to which the low-level power supply potential VSS is supplied.

The inverter 201 illustrated in FIG. 2B operates such that one of the p-channel transistor 207 and the n-channel transistor 208 is turned on and the other is turned off according to the level of potentials supplied to the gate electrodes thereof. Thus, current between the node to which the power supply potential VDD is supplied and the node to which the power supply potential VSS is supplied should be ideally zero.

However, actually a minute amount of off-state current flows in the off-state transistor; therefore, the current between the nodes can not be zero. A similar phenomenon also occurs in the inverter 202. Therefore, power is consumed in the memory element 200 even in a state where data is just being held.

In the case of an inverter manufactured using bulk silicon, although it depends on the size of a transistor, an off-state current of about 0.1 pA is generated at room temperature at a power supply voltage of 1 V, for example. The memory element illustrated in FIGS. 2A and 2B includes two inverters: the inverter 201 and the inverter 202; therefore, an off-state current of about 0.2 pA is generated. In the case of a CPU including about $10^7$ memory elements, the off-state current in the whole register is about 2 µA.

Further, since the thickness of a gate insulator is reduced in accordance with progress of miniaturization, the amount of leakage current (gate leakage current) flowing between a gate and a channel through the gate insulator positioned therebetween becomes too large to ignore.

In addition, recently, the threshold value of the transistor has been reduced in order to compensate for a reduction in speed due to lowering of the power supply voltage. However, such reduction in the threshold voltage results in a further increase in the off-state current by approximately three orders of magnitude per inverter, in some cases.

According to the above, the power consumption of the register is increased against a decrease in a line width of a circuit. Furthermore, heat generated by consuming power causes an increase in temperature of the IC chip, and then power consumption is further increased, which results in a vicious circle.

Like the register, an SRAM also includes an inverter, and thus power is consumed due to the off-state current of a transistor. As described above, as in the case of the memory element (register), power is consumed in a cache memory including the SRAM even in a state where writing of data is not performed.

In order to suppress power consumption, a method for temporarily stopping the supply of a power supply potential to a memory device in a period during which data is not input and output has been suggested. A volatile memory device in which data is erased when the supply of a power supply potential is stopped is used for a register and a cache memory. Therefore, in the method, a nonvolatile memory device is provided around the volatile memory device and the data is temporarily transferred to the nonvolatile memory device. However, since such a nonvolatile memory device is mainly formed using a magnetic element or a ferroelectric, the manufacturing process is complex.

In addition, in the case where the power supply is stopped for a long time in a CPU, data in a memory device is transferred to an external memory device such as a hard disk or a flash memory before the power supply is stopped, so that the data can be prevented from being erased. However, it takes time to place the data back in a register, a cache memory, and a main memory from such an external memory device. Therefore, back up of data using the external memory device such as a hard disk or a flash memory is not suitable for the case where the power supply is stopped for a short time (e.g., for 100 microseconds to one minute) for reducing power consumption.

In view of the above-described problems, it is an object of one embodiment of the present invention to provide a signal processing circuit for which a complex manufacturing process is not necessary and whose power consumption can be suppressed and a method for driving the signal processing circuit. In particular, it is an object to provide a signal processing circuit whose power consumption can be suppressed by stopping the power supply for a short time and a method for driving the signal processing circuit.

In a memory element including a logic element by which the phase of an input signal is inverted and the signal is output (hereinafter, the logic element is referred to as a phase-inversion element) such as an inverter or a clocked inverter, a capacitor which holds data and a capacitor switching element which controls storing and releasing of electric charge in the capacitor are provided.

In addition, for the capacitor switching element, a transistor is used. In the transistor, amorphous silicon, polysilicon, microcrystalline silicon, or a compound semiconductor (preferably, wide-bandgap compound semiconductor) such as an oxide semiconductor, which is formed in one plane including unevenness to have a film form, is included in a channel formation region, and the channel length is ten times or more as large as the minimum feature size, preferably 20 times or more as large as the minimum feature size, further preferably 50 times or more as large as the minimum feature size, or larger than or equal to 1 μm. In this case, the channel length of the transistor may be ten times or more as large as the channel width, preferably 20 times or more as large as the channel width, further preferably 50 times or more as large as the channel width. The above memory element is used for a memory device such as a register, a cache memory, or a main memory in a signal processing circuit.

Note that the wide-bandgap compound semiconductor in this specification refers to a compound semiconductor having a bandgap of 2 eV or more. Examples of the wide-bandgap compound semiconductor other than an oxide semiconductor include a sulfide such as zinc sulfide and a nitride such as gallium nitride. It is preferable that the wide-bandgap compound semiconductor be highly purified to extremely reduce the concentration of donor or acceptor.

The capacitor switching element is preferably formed above the phase-inversion element and overlaps therewith. A semiconductor layer used in the capacitor switching element has a meandering shape or at least one hollow portion when it is viewed from above, thereby being formed in a limited area over (one or plural) phase-inversion elements. Accordingly, the above channel length can be achieved.

Note that one capacitor switching element may be provided above a plurality of phase-inversion elements and overlaps therewith. Alternatively, a plurality of capacitor switching elements may be formed above one phase-inversion element and overlap therewith.

The above circuit such as a register or an SRAM includes a circuit in which two phase-inversion elements (such as inverter) are combined (e.g., flip-flop circuit). The area occupied by the circuit in which two inverters are combined is 50 $F^2$ (F is the minimum feature size) or more, and generally 100 $F^2$ to 150 $F^2$. For example, in the case where the area occupied by the circuit in which two inverters are combined is 50 $F^2$ and the capacitor switching element is provided in the half the area (25 $F^2$) of the circuit in which two inverters are combined, the channel length can be 25 F on the assumption that the channel width is F.

Further, the capacitor is also preferably formed above the phase-inversion element and overlaps therewith, and may be formed in the same layer as the capacitor switching element or in a different layer from the capacitor switching element. When the capacitor is formed in the same layer as the capacitor switching element, although it is necessary to form a region for the capacitor switching element and a region for the capacitor, the manufacturing process can be simplified. On the other hand, when the capacitor is formed in a different layer from the capacitor switching element, although the number of steps for manufacturing the capacitor is increased, there are advantages that the integration degree is increased, an area used for the capacitor is increased, and the like. Thus, a dielectric body of the capacitor can be formed using a different component from a gate insulator of the capacitor switching element; as a result, capacitance can be increased.

The on-resistance of the switching element and the capacitance of the capacitor may be determined in accordance with the speed of the needed switching operation. In the case of stopping or resuming supply of the power, the necessary time for switching operation is only 100 microseconds or shorter. Depending on the purpose, the time for switching may be 100 milliseconds or longer. Further, the off-resistance of the switching element and the capacitance of the capacitor may be determined in accordance with the interval between the needed switching operations.

Further, the signal processing circuit includes various logic circuits such as an arithmetic circuit which transmits/receives data to/from the memory device in addition to the above memory device. Not only the supply of power supply voltage to the memory device but also the supply of power supply voltage to the arithmetic circuit which transmits/receives data to/from the memory device may be stopped.

Specifically, a memory element at least includes two phase-inversion elements (first and second phase-inversion elements), a capacitor, and a capacitor switching element which controls storing and releasing of electric charge in the capacitor. A signal including data that is input to the memory element is input to an input terminal of the first phase-inversion element. An output terminal of the first phase-inversion element is connected to an input terminal of the second phase-inversion element. An output terminal of the second phase-inversion element is connected to the input terminal of the first phase-inversion element. A potential of the output terminal of the first phase-inversion element or the input terminal of the second phase-inversion element is output to a memory element or another circuit of a subsequent stage as a signal.

Each of the phase-inversion elements has a structure in which at least one p-channel transistor and at least one n-channel transistor whose gate electrodes are connected to each other are connected in series between a first node and a second node.

In order to store data of a signal as needed, which is input to the memory element, the capacitor is connected to a node to which a potential of the signal is supplied, via the capacitor switching element.

In the state where a power supply voltage is applied between the first node and the second node, when the signal including the data is input to the input terminal of the first phase-inversion element, the data is held by the first phase-inversion element and the second phase-inversion element. In the case where the application of the power supply voltage between the first node and the second node is stopped, before the application of the power supply voltage is stopped, the capacitor switching element is turned on and the data of the signal is stored in the capacitor. With the above-described structure, even when the application of the power supply voltage to the phase-inversion elements is stopped, data can be held in the memory element.

A channel formation region of a transistor which is used as the capacitor switching element may include amorphous silicon, polysilicon, microcrystalline silicon, or a compound semiconductor (e.g., highly-purified oxide semiconductor). In addition, the channel is sufficiently long; thus, the amount of off-state current is small.

On the other hand, in a transistor used in the phase-inversion element, an amorphous, microcrystalline, polycrystalline, or single crystal semiconductor can be used. As a material of such a semiconductor, silicon, gallium arsenide, gallium phosphide, germanium, or the like can be given. In addition, for manufacturing the above-described transistor, a thin semiconductor film or a bulk semiconductor (semiconductor wafer) may be used.

As an oxide semiconductor, an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor; or an In—Ga—O-based oxide semiconductor which are two-component metal oxides; or an In—O-based oxide semiconductor, a Sn—O-based oxide semiconductor, or a Zn—O-based oxide semiconductor which are single-component metal oxides can be used.

In this specification, for example, the term "In—Sn—Ga—Zn-based oxide semiconductor" means a metal oxide containing indium (In), tin (Sn), gallium (Ga), and zinc (Zn) and may have any stoichiometric ratio. The above oxide semiconductor may contain silicon, sulfur, nitrogen, or the like.

Alternatively, oxide semiconductors which can be represented by the chemical formula, $InMO_3(ZnO)_m$ (m>0) can be used. Here, M denotes one or more metal elements selected from Ga, Al, Mn, and Co.

The oxide semiconductor is a metal oxide having a relatively high mobility (greater than or equal to 1 $cm^2$/Vs, preferably greater than or equal to 10 $cm^2$/Vs) as semiconductor characteristics. In addition, an oxide semiconductor which is highly purified by reducing an impurity serving as an electron donor (donor), such as moisture or hydrogen, is an i-type semiconductor (intrinsic semiconductor, in this specification, a semiconductor having a carrier concentration of $1\times10^{12}$/$cm^3$ or lower is called i-type semiconductor) or a semiconductor extremely close to an i-type semiconductor (a substantially i-type semiconductor).

Specifically, impurities such as moisture or hydrogen included in the oxide semiconductor are removed so that the value of the hydrogen concentration in the oxide semiconductor measured by secondary ion mass spectrometry (SIMS) can be less than or equal to $5\times10^{19}$/$cm^3$, preferably less than or equal to $5\times10^{18}$/$cm^3$, further preferably less than or equal to $5\times10^{17}$/$cm^3$, still further preferably less than or equal to $1\times10^{16}$/$cm^3$.

With the above-described structure, the carrier density of an oxide semiconductor film, which can be measured by Hall effect measurement, can be less than $1\times10^{14}$/$cm^3$, preferably less than $1\times10^{12}$/$cm^3$, further preferably less than $1\times10^{11}$/$cm^3$ that is a value less than or equal to measurement limit. That is, the carrier density of the oxide semiconductor film can be extremely close to zero.

Further, the bandgap of the used oxide semiconductor is greater than or equal to 2 eV and less than or equal to 4 eV, preferably greater than or equal to 2.5 eV and less than or equal to 4 eV, further preferably greater than or equal to 3 eV and less than or equal to 4 eV. By using a highly purified oxide semiconductor film with the wide bandgap as described and sufficiently reduced concentration of impurities such as moisture or hydrogen, the off-state current of the transistor can be reduced.

The analysis of the concentrations of hydrogen in the oxide semiconductor film and a conductive film is described here. Measurements of the hydrogen concentration in the oxide semiconductor film and the hydrogen concentration in the conductive film are performed by SIMS. It is known that it is difficult to obtain accurate data in the proximity of a surface of a sample or in the proximity of an interface between stacked films formed using different materials, by the SIMS in principle.

Thus, in the case where distribution of the hydrogen concentrations in the film in a thickness direction is analyzed by SIMS, an average value in a region of the film in which the value is not greatly changed and substantially the same value can be obtained is employed as the hydrogen concentration.

Further, in the case where the thickness of the film is small, a region where substantially the same value can be obtained cannot be found in some cases due to the influence of the hydrogen concentration in an adjacent film. In that case, the maximum value or the minimum value of the hydrogen concentration in the region of the film is employed as the hydrogen concentration of the film. Furthermore, in the case where a mountain-shaped peak having a maximum value or a valley-shaped peak having a minimum value do not exist in the region of the film, the value at an inflection point is employed as the hydrogen concentration.

Note that it has been found that the oxide semiconductor film formed by sputtering or the like includes a large amount of impurities such as moisture or hydrogen. Moisture and hydrogen easily form a donor level and thus serve as impurities in the oxide semiconductor.

Therefore, in one embodiment of the present invention, in order to reduce impurities such as moisture or hydrogen in the oxide semiconductor film, the oxide semiconductor film is subjected to heat treatment in a reduced pressure atmosphere, an atmosphere of an inert gas such as nitrogen or a rare gas, an oxygen gas atmosphere, or an ultra dry air atmosphere (the moisture amount is less than or equal to 20 ppm (−55° C. by conversion into a dew point), preferably less than or equal to 1 ppm, further preferably less than or equal to 10 ppb, in the case where measurement is performed with use of a dew point meter of a cavity ring down laser spectroscopy (CRDS) system).

The above heat treatment is preferably performed at a temperature from 300° C. to 850° C. inclusive, further preferably from 550° C. to 750° C. inclusive. Note that this heat treatment is performed at a temperature not exceeding the allowable temperature limit of the substrate to be used. An effect of elimination of moisture or hydrogen by the heat treatment has been confirmed by thermal desorption spectrometry (TDS).

A furnace or a rapid thermal annealing method (RTA method) is used for the heat treatment. As the RTA method, a method using a lamp light source or a method in which heat treatment is performed for a short time while a substrate is moved in a heated gas can be employed. By the use of the RTA method, it is also possible to make the time necessary for heat treatment shorter than 0.1 hours.

Specifically, the transistor including the oxide semiconductor film that is highly purified by the above heat treatment as an active layer has an extremely small amount of off-state current (extremely high off-resistance). Specifically, even when an element has a channel width (W) of $1\times10^6$ μm (a channel length (L) of 1 μm), the off-state current (drain current when the voltage between a gate electrode and a source electrode is lower than or equal to 0 V) at a drain voltage (voltage between the source electrode and the drain electrode) of 1 V can be lower than or equal to the measurement limit of a semiconductor parameter analyzer, i.e., less than or equal to $1\times10^{-13}$ A.

In this case, the off-state current density (off-state current per micrometer of the channel width) is less than or equal to 100 zA/μm. In the transistor having a long and narrow channel, the off-state current is less than or equal to 1 zA. Thus, the transistor including the highly purified oxide semiconductor film as an active layer has an extremely smaller amount of off-state current than a transistor including silicon having crystallinity.

By using the transistor having the above structure as a capacitor switching element for controlling release of electric charge stored in the capacitor, leakage of electric charge from the capacitor can be prevented; therefore, even without application of power supply voltage, data is not erased but can be held.

In a period during which data is held in the capacitor, the power supply voltage is not necessarily supplied to the phase-inversion elements; as a result, surplus power consumption due to the off-state current of transistors used for the phase-inversion elements can be reduced, and the power consumption of the memory device and further the signal processing circuit including the memory device can be suppressed to low.

Note that the off-state current of the capacitor switching element is determined depending on capacitance of the capacitor and a period of time for holding data. For example, in the case where a transistor including a highly purified oxide semiconductor is used for the capacitor switching element, the off-state current can be less than or equal to 1 zA when the drain voltage is 1 V as described above. For example, when the capacitance of the capacitor is 1 fF, data can be held for one day or longer.

In some cases, a long period of time is not needed for holding data. For example, in the case of holding data for only a second, the off-state current may be less than or equal to 0.1 fA on the assumption that the capacitance of the capacitor is 1 fF.

Unlike the case of using a highly purified oxide semiconductor, a small off-state current less than or equal to 1 zA cannot be achieved by using amorphous silicon, polysilicon, microcrystalline silicon, or the like. However, the off-state current can be reduced to 0.1 fA or less by forming a long and narrow channel or reducing a thickness of a semiconductor layer as described in Patent Document 1.

Note that the amount of off-state current is proportional to the mobility of the semiconductor; thus, the lower the mobility becomes, the more reduced the off-state current is. Therefore, the off-state current in a transistor including amorphous silicon is smaller than that of a transistor including polysilicon. A transistor including a semiconductor with low mobility has inferior switching element, which is hardly problematic. Descriptions thereof will be made later.

By applying the memory element having the above structure to a memory device such as a register or a cache memory included in a signal processing circuit, data in the memory device can be prevented from being erased owing to the stop of the power supply. Therefore, the power supply can be stopped even for a short time in the signal processing circuit or one or a plurality of logic circuits included in the signal processing circuit. Accordingly, it is possible to provide a signal processing circuit whose power consumption can be suppressed and a method for driving the signal processing circuit whose power consumption can be suppressed.

Note that one of reasons for setting the channel length of the capacitor switching element to be the above length is to reduce the off-state current, and another reason is to prevent the short channel effect. For example, in the transistor including an oxide semiconductor, an extremely small amount of off-state current is measured as described. Such a feature is caused by a wide bandgap of the oxide semiconductor, which is about three times bandgap of silicon.

A wide bandgap means few thermally excited carriers. For example, silicon has a bandgap of 1.1 eV at room temperature and thus thermally excited carriers exist therein at approximately $1\times10^{11}/cm^3$, while in a semiconductor with a bandgap of 3.2 eV, thermally excited carriers exist at approximately $1\times10^{-7}/cm^3$ according to calculation.

In the case of silicon, carriers generated by thermal excitation exist as described above even in silicon including no impurities, and thus the resistivity of the silicon cannot be $1\times10^5$ Ωcm or higher at room temperature. In contrast, in the case of the semiconductor with a bandgap of 3.2 eV, a resistivity of $1\times10^{30}$ Ωcm or higher can be obtained in theory.

When a transistor is manufactured using such a semiconductor and its high resistivity in an off state (a state where the potential of a gate electrode is the same as the potential of a source electrode) is utilized, it is expected that electric charge can be retained semipermanently. However, such characteristics can be obtained in the case where the channel length is sufficiently large (greater than or equal to 500 nm) but is not sufficiently obtained in the case where the channel length is less than or equal to 100 nm. The reason is as follows.

In the case where a switching element (such as a transistor) is formed using an oxide semiconductor, there are almost no reports on oxide semiconductors, particularly an oxide semiconductor including zinc or indium, which have p-type conductivity. Therefore, a transistor using a PN junction, like a transistor including silicon, has not been reported, and a conductor-semiconductor junction (such a junction is generally called a metal-semiconductor junction or a metal-insulator junction in academic books; in this specification, the term "conductor-semiconductor junction" is used for accurate interpretation of the term) as disclosed in Patent Document 2, where a conductor electrode is in contact with an n-type oxide semiconductor, has been used for forming a source and a drain.

In a transistor where a source and a drain are formed with a conductor-semiconductor junction, when the carrier concentration of the semiconductor is high, current (off-state current) flows between the source electrode and the drain electrode even in an off state. Therefore, an i-type semiconductor is obtained by lowering the carrier concentration in the semiconductor, so that the off-state current can be reduced. However, only by this method, the off-state current cannot be sufficiently reduced when the channel length of the transistor is reduced to less than or equal to 100 nm.

In a conductor-semiconductor junction, in general, an ohmic junction or a Schottky barrier junction is formed depending on the relation between a work function of a conductor and an electron affinity (or a Fermi level) of a semiconductor. For example, if an ideal conductor-semiconductor junction (a junction where no trap level or no compound is formed at the interface) is formed by making a conductor with a work function of 3.9 eV in contact with a semiconductor with an electron affinity of 4.3 eV, electrons flow from the conductor into the semiconductor.

In that case, the closer the electrons in the semiconductor are to the junction interface between the conductor and the semiconductor, the higher the concentration of electrons is. The concentration of electrons in the semiconductor decreases with increasing distance from the junction interface; however, even at a portion which is several μm away from the interface junction, the concentration of electrons is so high that the semiconductor cannot be regarded as an i-type semiconductor. That is, even when the semiconductor itself is an i-type semiconductor, contact with a conductor produces a region with a high carrier concentration. As a result of formation of such a region including many carriers in the vicinity of the interface of the conductor-semiconductor junction, the conductor-semiconductor junction becomes an ohmic junction.

In contrast, for example, if an ideal conductor-semiconductor junction is formed by making a conductor with a work function of 4.9 eV in contact with a semiconductor with an electron affinity of 4.3 eV, electrons existing in the semiconductor move to the conductor. In a region which the electrons have left (depletion region), the electron concentration is, as is obvious, extremely low. The width of the depletion region depends on the electron concentration of the semiconductor; for example, when an original electron concentration of the semiconductor is $1\times10^{18}/cm^3$, the width is several tens of nanometers.

The electron concentration in this portion becomes significantly low; accordingly, a barrier is formed at a junction interface between the conductor and the semiconductor in a band diagram. A conductor-semiconductor junction including such a barrier is referred to as a Schottky barrier junction. Electrons easily flow from the semiconductor to the conductor, whereas electrons are less likely to flow from the conductor to the semiconductor owing to the barrier. Therefore, rectification action is observed in the Schottky barrier junction.

Even when the conductor is not directly contact with the semiconductor, in some cases, a region with high electron concentration or a depletion region is formed in the semiconductor as the above. For example, even in the case where an insulating film is provided between a semiconductor and a conductor, the electron concentration of the semiconductor is influenced by the conductor. Needless to say, the degree of the influence of the conductor depends on the thickness or the dielectric constant of the insulating film. When the thickness of the insulating film is increased or when the dielectric constant thereof is lowered, the influence of the conductor is reduced.

It is preferable that a junction between a source electrode and a semiconductor or between a drain electrode and the semiconductor be formed so that current flows easily; thus, in a transistor as disclosed in Patent Document 2, a conductive material is selected so that an ohmic junction is formed. For example, titanium and titanium nitride are given. When a junction between an electrode and a semiconductor is an ohmic junction, there are advantages of stable characteristics of a transistor to be obtained and of high percentage of non-defective products.

As a material of a gate electrode, a material having action that eliminates electrons from a semiconductor is selected. For example, a material with a high work function, such as tungsten, platinum, or indium nitride, is selected. When such a material is used and the ratio L/T is 10 or more, where L is a channel length (typically, the distance between a source electrode and a drain electrode) and T is the sum of the effective thicknesses of a gate insulator and the semiconductor (hereinafter T is referred to as a typical thickness), a transistor having an off-state current in the case where the potential of the gate electrode is equal to that of the source electrode (hereinafter referred to as zero current) of $1\times10^{-16}$ A or lower can be manufactured.

Here, the typical thickness T is calculated by the following formula: T=(the thickness of a gate insulator×the dielectric constant of a semiconductor/the dielectric constant of the gate insulator)+the thickness of the semiconductor. For example, when the thickness of the In—Ga—Zn-based oxide semiconductor is 5 nm and the thickness of a gate insulator formed using silicon oxide is 15 nm, T=65 nm because the dielectric constant of an In—Ga—Zn-based oxide semiconductor is four times a high as that of silicon oxide. In that case, in order to satisfy L/T=10, the channel length L is required to be greater than or equal to 650 nm. When the thickness of the gate insulator is 5 nm, the channel length L may be 250 nm.

In other words, the channel length is increased and the thickness of the gate insulator is reduced, whereby a transistor whose zero current is further reduced can be obtained. On the other hand, when the ratio L/T is decreased, especially when the ratio L/T is 4 or less, it is impossible to keep zero current lower than that of a transistor including silicon.

A cause of that phenomenon is described with reference to FIGS. 3A to 3C. FIG. 3A illustrates a typical structure of a transistor having a conductor-semiconductor junction. Specifically, a source electrode 302 and a drain electrode 303 are provided on one surface of a semiconductor layer 301. On the other surface of the semiconductor layer 301, a gate insulator 304 is provided, and a gate electrode 305 is further provided thereover.

A conductor is selected for the source electrode 302 and the drain electrode 303 so that ohmic junctions are formed between the source electrode 302 and the semiconductor layer 301 and between the drain electrode 303 and the semiconductor layer 301. Accordingly, an action of injection of electrons into the semiconductor layer 301 is generated. Thus, by using a material whose work function is higher than the electron affinity of the semiconductor for the gate electrode 305, electrons flowing from the source electrode 302 or the drain electrode 303 are eliminated.

An effect of the action of injection of electrons and an effect of the action of elimination of electrons at a position are thought to depend on respective distances from the source electrode 302 or the drain electrode 303 and the gate 305 at the position. In order to simplify the explanation, it is assumed that a force of the source electrode 302 or the drain electrode 303 for injecting electrons into the semiconductor layer 301 is equal to a force of the gate electrode 305 for eliminating electrons from the semiconductor layer 301. Thus, at a position in the semiconductor layer 301 where the distances from the source electrode 302, the drain electrode 303, and the gate electrode 305 are equal, the opposing forces are balanced; thus, the electron concentration therein is equal to an original value (if the semiconductor layer is an i-type semiconductor, the concentration of electrons caused by thermal excitation).

At a position which is closer to the source electrode 302 or the drain electrode 303 than the gate electrode 305, the source electrode 302 or the drain electrode 303 has a stronger effect, and the electron concentration is higher at the position. In contrast, at a position which is closer to the gate electrode 305 than the source electrode 302 or the drain electrode 303, the gate electrode 305 has a stronger effect, and the electron concentration is lower at the position.

Here, a point to be considered about the distance is described. It should be noted that the distance in this case means not a spatial distance but an electromagnetic distance; therefore, the comparison needs to be made on the basis of a value obtained by multiplying a spatial distance by a dielectric constant.

FIG. 3B illustrates conceptual isoconcentration lines of the electron concentration in the semiconductor layer 301 of the transistor in FIG. 3A, which is based on the above premise. In order to simplify the explanation, the dielectric constant of the gate insulator 304 is assumed to be equal to the dielectric constant of the semiconductor layer 301. In addition, the potentials of the source electrode 302 and the drain electrode 303 are equal to the potential of the gate electrode 305.

There are regions 301a where the electron concentration is high in the vicinity of an interface between the semiconductor layer 301 and the source electrode 302 and an interface between the semiconductor layer 301 and the drain electrode 303. Further, regions 301b where the electron concentration is lower than the electron concentration in the regions 301a by approximately one order of magnitude, regions 301c where the electron concentration is lower than that in the regions 301b by approximately one order of magnitude, a region 301d where the electron concentration is lower than that in the regions 301c by approximately one order of magnitude, and a region 301e where the electron concentration is lower than that in the region 301d exist outside the regions 301a in this order.

When the distance between the source electrode 302 and the drain electrode 303 is small as compared with the typical thickness T, as illustrated in FIG. 3B, the region 301d is not divided in the vicinity of a surface of the semiconductor layer 301, which is opposite to the gate electrode 305. This is because the force of the gate electrode 305 does not reach that region and electrons are injected by the forces of the source electrode 302 and the drain electrode 303.

In FIG. 3B, the ratio L/T is a little less than 2. Assuming that the distance between the source electrode 302 and the drain electrode 303 is 120 nm, the thickness of the semiconductor layer 301 is 50 nm; thus, the electron concentration on the isoconcentration line between the region 301a and the region 301b is approximately $1 \times 10^{20}/cm^3$, and the electron concentration on the isoconcentration line between the region 301d and the region 301e is approximately $1 \times 10^{17}/cm^3$.

As illustrated in FIG. 3B, since the electron concentration of part (corresponding to greater than or equal to one third) of the semiconductor layer 301 is $1 \times 10^{17}/cm^3$, when the potential difference between the source electrode 302 and the drain electrode 303 is 1 V, a zero current that is as large as 0.1 μA flows (under the condition where the channel length is equal to the channel width).

In order to reduce the zero current, the electron concentration on the side opposite to the gate electrode needs to be prevented from being such an unignorable value. Thus, it is necessary that the value of distance between the source electrode 302 and the drain electrode 303 is sufficiently increased as compared with the value of thickness of the semiconductor layer 301 or the value of thickness of the gate insulator 304, so that a region which the effect of the gate electrode 305 sufficiently reaches and the effect of the source electrode 302 and the drain electrode 303 does not reach is formed in a lower part of the semiconductor layer 301. In such a region, the electron concentration is extremely low and the resistivity is significantly high.

In the case where the zero current is not sufficiently reduced even when the distance between the source electrode 302 and the drain electrode 303 is adequately increased, the potential of the gate electrode 305 is lower than the potential of the source electrode 302, whereby the number of electrons is reduced in the semiconductor layer 301 and thus resistivity of the semiconductor layer 301 can be increased.

As suggested by the above explanation, it is found by calculation that the relation between the drain current ($I_D$) and the gate voltage ($V_G$) of the transistor ($I_D$-$V_G$ curve) depends on the channel length as shown in FIG. 3C. Two curves shown in FIG. 3C are $I_D$-$V_G$ curves of transistors in each of which the channel length is equal to the channel width. Note that the curves shown in FIG. 3C are for simply explaining variation in characteristics of the transistors.

Among ideal transistors in each of which the channel length is equal to the channel width, the on-state current does not change depending on the channel length, whereas the threshold voltage or the subthreshold characteristic value changes in some cases. This phenomenon is known as a short channel effect in a normal MOS transistor as well. As shown in FIG. 3C, in a transistor having a conductor-semiconductor junction, the threshold voltage or the subthreshold characteristic value (S value) changes depending on the channel length.

In FIG. 3C, the channel length of the transistor which is denoted by "long channel" is approximately 20 times the channel length of the transistor denoted by "short channel". Thus, as the channel length is decreased, the drain current in the case where the voltage of a gate electrode is set to 0 V to be the same as the voltage of a source electrode (i.e., zero current) is increased and the curve becomes gentler (the S value is increased). Therefore, the transistor used as the capacitor switching element of the present invention is preferably a transistor having a sufficiently large channel length.

Note that the above description can also be applied to the case of using silicon or the like for a channel formation region in which the impurity concentration is significantly low. Also in this case, the zero current is increased to an unignorable amount by entry of carrier into the channel formation region from the source or drain. Thus, in the case of using amorphous silicon, polysilicon, microcrystalline silicon, or the like for the capacitor switching element and the case of significantly reducing the impurity concentration in the channel formation region, the amount of off-state current can be sufficiently small under the condition of a long channel.

There is concern that in such a transistor having a long and narrow channel, the on-resistance is high and adequate switching operation cannot be obtained accordingly. However, the operations of stopping and resuming supply of power may be extremely slow operation as compared with the clock speed of a logic circuit. In other words, a period of 100 microseconds or shorter is enough for a switching operation, and in some cases, the switching time may be a millisecond or longer.

This is because a process in which data held in a flip flop circuit of each memory element is transferred to the capacitor or a process in which data held in the capacitor is transferred to a flip flop circuit of each memory element can be conducted simultaneously in all the memory elements. Such a low-speed operation causes no defect in a transistor with a long and narrow channel. The mobility of a semiconductor may be 1 cm$^2$/Vs or higher.

In general, there is a relation between the on-current to $I_{on}$ to the off-state current $I_{off}$ and the time $\tau_{on}$ needed for switching operation to the time $\tau_{off}$ for holding data as follows:

$$\tau_{off}/\tau_{on} \sim I_{on}/I_{off} \times 1/100$$

Thus, when the on-state current $I_{on}$ is $10^8$ times as large as the off-state current $I_{off}$, $\tau_{off}$ is approximately $10^6$ times as large as $\tau_{on}$. For example, in the case where a time necessary for the capacitor switching element to inject electric charge to the capacitor is a microsecond, the capacitor and the capacitor switching element can hold data for a second. If a period during which data is held is longer than a second, an operation in which the held data is returned to a flip-flop circuit or the like, amplified, and then captured in the capacitor (this operation is called refresh) may be repeated every second.

Further, in the capacitor, as the capacitance is high, an error at the time of returning data to the flip-flop circuit is less likely to occur. In contrast, when the capacitance is high, the response speed of a circuit including the capacitor and the capacitor switching element is decreased. However, the operation of stop and resuming supply of power may be extremely slow operation as compared with the clock speed of a logic circuit as described above. Thus, there is no problem when the capacitance is less than or equal to 1 pF.

Note that in the case of increasing capacitance as in a DRAM, generally, it is difficult to form a capacitor. However, according to one embodiment of the present invention, a capacitor may be formed over a phase-inversion element with an area of 50 F$^2$ or more; thus, formation of the capacitor is much easier than that in the DRAM in which a capacitor is formed in an area of 8 F$^2$ or less. A planar capacitor which can be formed without a special manufacturing method may be employed.

Furthermore, when a transistor used for the capacitor switching element has a long and narrow channel, the off-state current of the transistor can be reduced, and influence of the parasitic capacitance formed by wirings can be small. Thus, the capacitance of the capacitor may be much lower than that (about 30 fF) used in a DRAM.

Note that when electric charge is drastically transferred from the phase-inversion element to the capacitor, stability of the phase-inversion elements is decreased and accordingly data stored in the phase-inversion element may be corrupted. In such a case, wrong data is held in the capacitor.

In order to prevent the above problem, the on-state current of the capacitor switching element may be reduced to some extent. A transistor with a long and narrow channel or a transistor with a mobility of 10 cm$^2$/Vs or lower, as described above, is suitable for this purpose.

According to one embodiment of the present invention, data can be transferred and held in the capacitor, and supplying power of the memory element can be stopped. Thus, the threshold value of a transistor used for the phase-inversion element in the memory element may be reduced. That is, a memory element which operates at high speed and consumes less power can be obtained.

DETAILED DESCRIPTION OF THE INVENTION

Figure 1A:
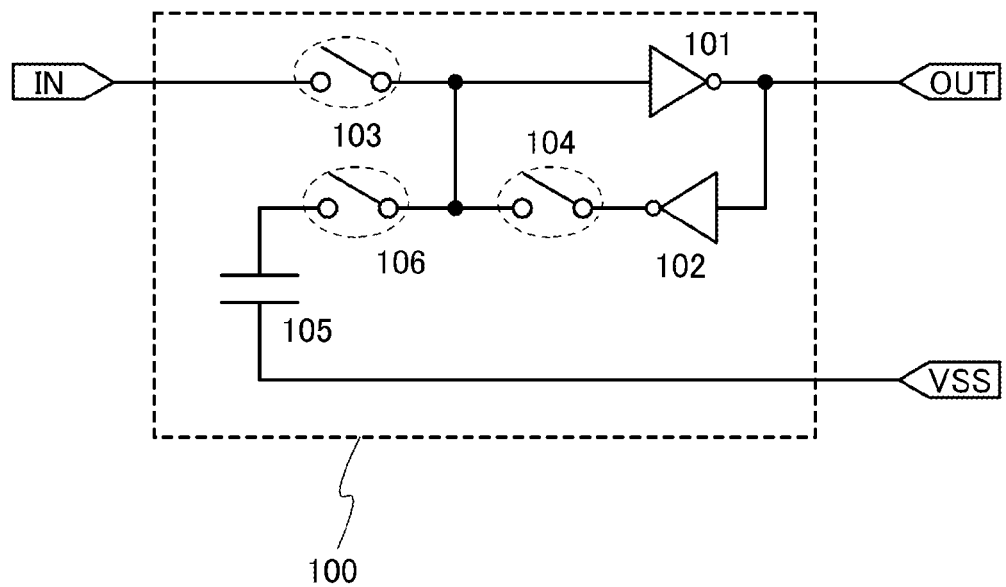
FIGS. 1A and 1B are circuit diagrams of a memory element.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Accordingly, the present invention should not be construed as being limited to the description of the embodiments below.

Note that "connection" in this specification means electrical connection and corresponds to the state in which current, voltage, or potential can be supplied, applied, or conducted. Therefore, a state of electrical connection means not only a state of direct connection but also a state of indirect connection through a circuit element such as a wiring, or a resistor, in which current, voltage, or a potential can be supplied or transmitted.

Note also that even when a circuit diagram shows independent components as if they are connected to each other, there is a case in which one conductive film has functions of a plurality of components such as a case in which part of a wiring also functions as an electrode. The term "connection" also means such a case where one conductive film has functions of a plurality of components.

The names of the "source (or source electrode)" and the "drain (or drain electrode)" included in the transistor interchange with each other depending on the polarity of the transistor or the levels of potentials applied to the respective electrodes. In general, in an n-channel transistor, an electrode to which a lower potential is applied is called a source (or source electrode), and an electrode to which a higher potential is applied is called a drain (or drain electrode). Further, in a p-channel transistor, an electrode to which a lower potential is supplied is called a drain (or drain electrode), and an electrode to which a higher potential is supplied is called a source (or source electrode).

In this specification, although connection relation of the transistor is described assuming that the source (or source electrode) and the drain (or drain electrode) are fixed in some cases for convenience, actually, the names of the source (or source electrode) and the drain (or drain electrode) interchange with each other depending on the relation of the potentials. Therefore, it is difficult to define which is the source (or the drain). Thus, in this specification, a region functioning as the source and the drain may not be called the source or the drain. In such a case, for example, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a source region and the other thereof may be called a drain region.

Note that in this specification, the state in which the transistors are connected to each other in series means the state in which only one of a source electrode and a drain electrode of a first transistor is connected to only one of a source electrode and a drain electrode of a second transistor. In addition, the state in which the transistors are connected to each other in parallel means the state in which one of a source electrode and a drain electrode of a first transistor is connected to one of a source electrode and a drain electrode of a second transistor and the other of the source electrode and the drain electrode of the first transistor is connected to the other of the source electrode and the drain electrode of the second transistor.

A signal processing circuit of the present invention includes, but is not limited to, in its category an integrated circuit such as a large scale integrated circuit (LSI) including a microprocessor, an image processing circuit, a digital signal processor (DSP), or a microcontroller.

Embodiment 1

A memory device which is one embodiment of the present invention includes one or a plurality of memory elements capable of storing 1-bit data. In FIG. 1A, an example of a circuit diagram of a memory element included in a memory device of the present invention is illustrated. A memory element 100 illustrated in FIG. 1A at least includes a first phase-inversion element 101 and a second phase-inversion element 102 by which the phase of an input signal is inverted and the signal is output, a switching element 103, a switching element 104, a capacitor 105, and a capacitor switching element 106.

A signal IN including data that is input to the memory element 100 is supplied to an input terminal of the first phase-inversion element 101 via the switching element 103. An output terminal of the first phase-inversion element 101 is connected to an input terminal of the second phase-inversion element 102. An output terminal of the second phase-inversion element 102 is connected to the input terminal of the first phase-inversion element 101 via the switching element 104. A potential of the output terminal of the first phase-inversion element 101 or the input terminal of the second phase-inversion element 102 is output as a signal OUT to a memory element or another circuit of a subsequent stage.

Note that in FIG. 1A, an example in which inverters are used as the first phase-inversion element 101 and the second phase-inversion element 102 is illustrated; however, a clocked inverter can also be used as the first phase-inversion element 101 or the second phase-inversion element 102 besides the inverter.

The capacitor 105 is connected to an input terminal of the memory element 100, i.e., a node to which a potential of the signal IN is supplied, via the switching element 103 and the capacitor switching element 106 so that the data of the signal IN that is input to the memory element 100 can be stored as needed. Specifically, the capacitor 105 includes a dielectric between a pair of electrodes. One of the electrodes is connected to the input terminal of the first phase-inversion element 101 via the capacitor switching element 106. The other of the electrodes is connected to a node to which a low-level power supply potential VSS or a fixed potential such as a ground potential is supplied.

For the capacitor switching element 106, a transistor including a highly purified oxide semiconductor in a channel formation region is used.

Note that the memory element 100 may further include another circuit element such as a diode, a resistor, an inductor, or a capacitor, as needed.

Figure 1B:
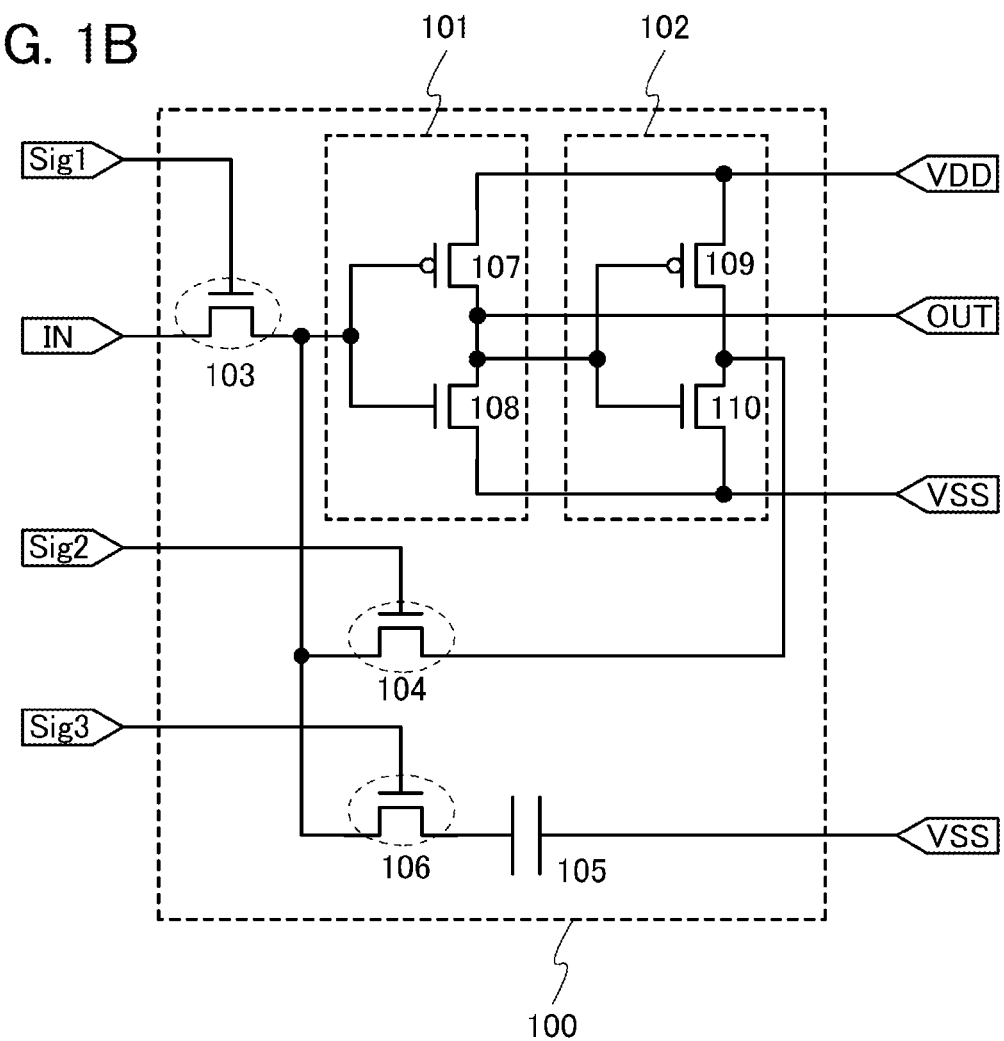
Figure 2A:
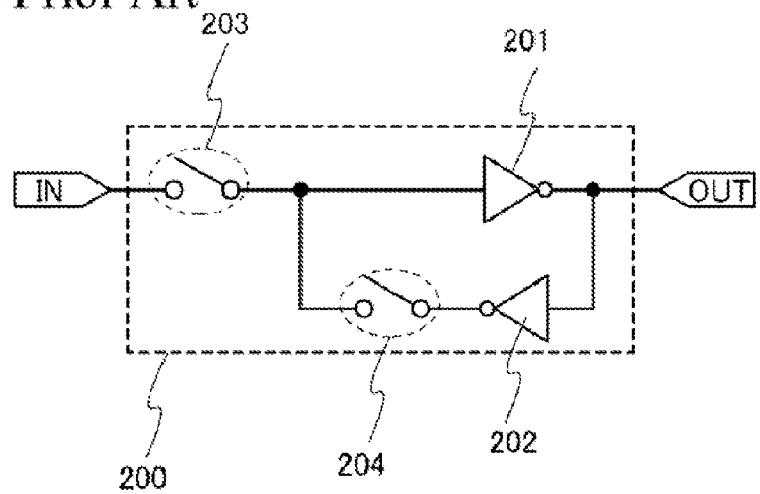
FIGS. 2A and 2B are circuit diagrams of a conventional memory element.
Figure 2B:
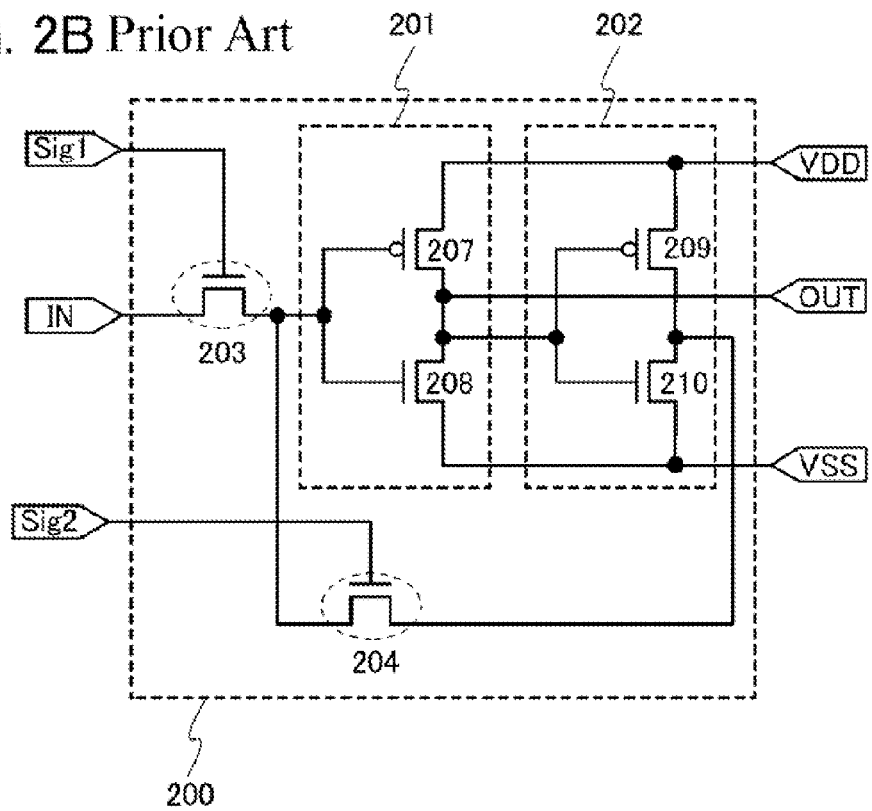
Figure 3A:
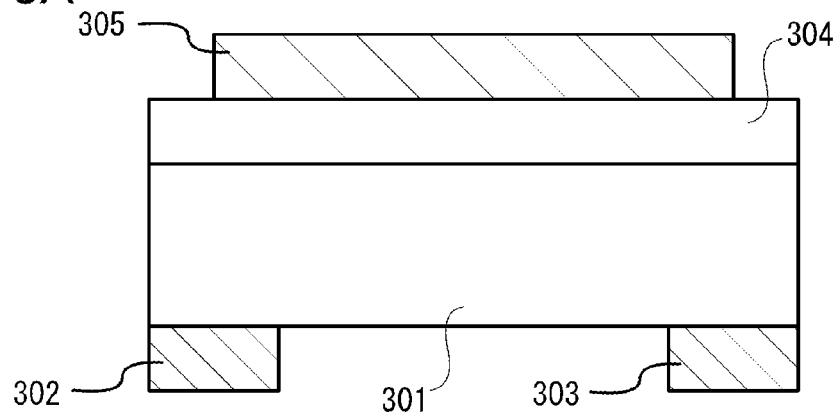
FIGS. 3A to 3C are diagrams for describing electric characteristics of a transistor including an oxide semiconductor.
Figure 3B:
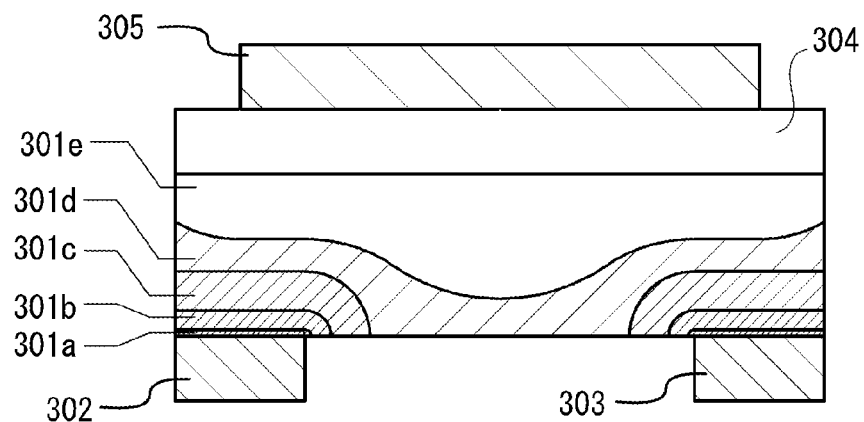
Figure 3C:
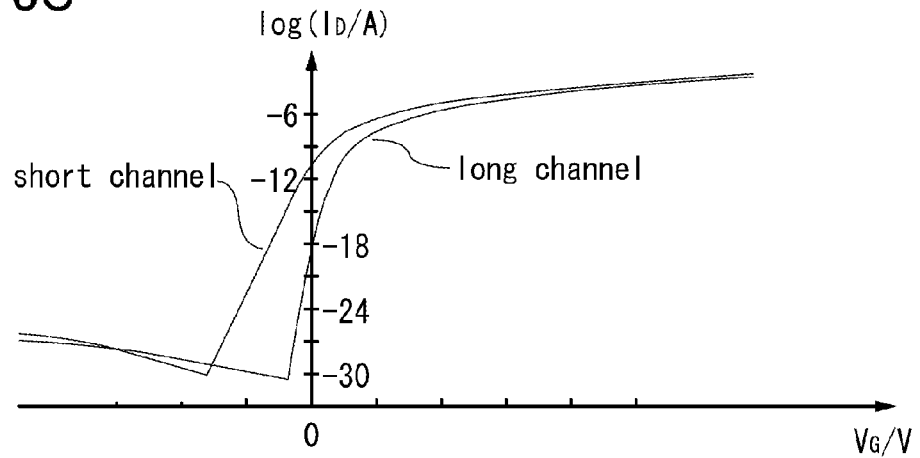

Next, an example of a more specific circuit diagram of the memory element of FIG. 1A is illustrated in FIG. 1B. The memory element 100 illustrated in FIG. 1B includes the first phase-inversion element 101, the second phase-inversion element 102, the switching element 103, the switching element 104, the capacitor 105, and the capacitor switching element 106. The connection structure of these circuit elements are the same as that in FIG. 1A.

The first phase-inversion element 101 in FIG. 1B has a structure in which a p-channel transistor 107 and an n-channel transistor 108 whose gate electrodes are connected to each other are connected in series between a first node to which a high-level power supply potential VDD is supplied and a second node to which a low-level power supply potential VSS is supplied.

Specifically, a source electrode of the p-channel transistor 107 is connected to the first node to which the power supply potential VDD is supplied, and a source electrode of the n-channel transistor 108 is connected to the second node to which the power supply potential VSS is supplied.

In addition, a drain electrode of the p-channel transistor 107 is connected to a drain electrode of the n-channel transistor 108, and potentials of the two drain electrodes can be regarded as a potential of the output terminal of the first phase-inversion element 101.

In addition, potentials of the gate electrode of the p-channel transistor 107 and the gate electrode of the n-channel transistor 108 can be regarded as a potential of the input terminal of the first phase-inversion element 101.

The second phase-inversion element 102 in FIG. 1B has a structure in which a p-channel transistor 109 and an n-channel transistor 110 whose gate electrodes are connected to each other are connected in series between the first node to which the high-level power supply potential VDD is supplied and the second node to which the low-level power supply potential VSS is supplied.

Specifically, a source electrode of the p-channel transistor 109 is connected to the first node to which the power supply potential VDD is supplied, and a source electrode of the n-channel transistor 110 is connected to the second node to which the power supply potential VSS is supplied.

In addition, a drain electrode of the p-channel transistor 109 is connected to a drain electrode of the n-channel transistor 110, and potentials of the two drain electrodes can be regarded as a potential of the output terminal of the second phase-inversion element 102.

In addition, potentials of the gate electrode of the p-channel transistor 109 and the gate electrode of the n-channel transistor 110 can be regarded as a potential of the input terminal of the second phase-inversion element 102.

In FIG. 1B, the case where one transistor is used for the switching element 103 is illustrated as an example, and the switching of the transistor is controlled by a signal Sig. 1 supplied to a gate electrode thereof. In addition, the case where one transistor is used for the switching element 104 is illustrated as an example, and the switching of the transistor is controlled by a signal Sig. 2 supplied to a gate electrode thereof.

Note that in FIG. 1B, a structure in which each of the switching element 103 and the switching element 104 includes only one transistor is illustrated; however, the present invention is not limited to this structure. In one embodiment of the present invention, the switching element 103 or the switching element 104 may include a plurality of transistors.

In the case where a plurality of transistors which serve as switching elements are included in the switching element 103 or the switching element 104, the plurality of transistors may be connected to each other in parallel, in series, or in combination of parallel connection and series connection.

In the case where a plurality of transistors are connected in parallel, polarity thereof may be different. For example, a so-called transfer gate structure in which an n-channel transistor and a p-channel transistor are connected in parallel may be employed.

In FIG. 1B, a transistor including an oxide semiconductor in a channel formation region is used for the capacitor switching element 106, and the switching of the transistor is controlled by a signal Sig. 3 supplied to a gate electrode thereof.

The transistor used for the capacitor switching element 106 includes a highly purified oxide semiconductor in the channel formation region. The channel length is ten times or more as large as the minimum feature size, preferably 20 times or more as large as the minimum feature size, further preferably 50 times or more as large as the minimum feature size, or larger than or equal to 1 μm. Therefore, the off-state current of the transistor is extremely small as described above.

In FIG. 1B, a structure in which the capacitor switching element 106 includes only one transistor is illustrated; however, the present invention is not limited to this structure. In one embodiment of the present invention, the capacitor switching element 106 may include a plurality of transistors.

In the case where a plurality of transistors which serve as switching elements are included in the capacitor switching element 106, the plurality of transistors may be connected to each other in parallel, in series, or in combination of parallel connection and series connection.

In this embodiment, at least a transistor used for a switching element in the capacitor switching element 106 may include a highly purified oxide semiconductor in a channel formation region.

The transistors used for the first phase-inversion element 101, the second phase-inversion element 102, the switching element 103, and the switching element 104 can include a semiconductor other than an oxide semiconductor, e.g., an amorphous, microcrystalline, polycrystalline, or single crystal semiconductor can be used. As a material of such a semiconductor, silicon, germanium, gallium arsenide, gallium phosphide, indium phosphide, or the like can be given. Further, for manufacturing such transistors, a thin semiconductor film or a bulk (semiconductor wafer) may be used.

Figure 7A:
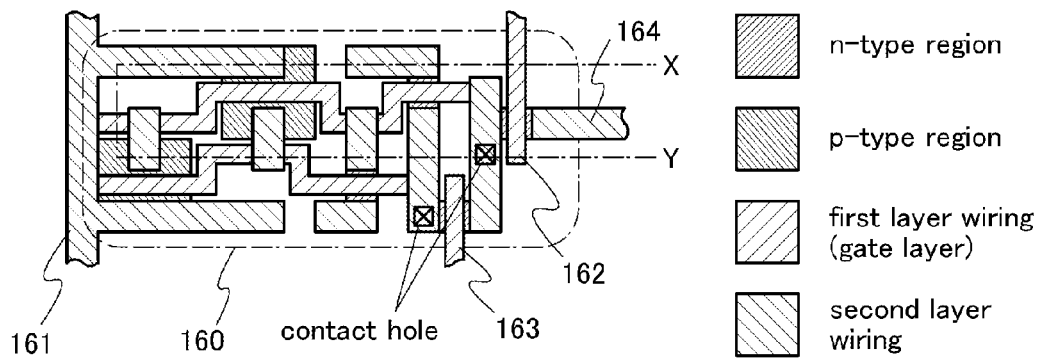
FIGS. 7A to 7D are top views illustrating a structure of a memory element.

An example of circuit arrangement of a memory element in this embodiment is described with reference to FIGS. 7A to 7D. FIG. 7A illustrates a layout of one memory element 160. The memory element 160 corresponds to the memory element 100 in FIGS. 1A and 1B. An inverter or the like which is a main component of the memory element 160 may be formed by using a known semiconductor technique. In a surface layer on one surface of a semiconductor wafer, a shallow trench isolation (STI) region for element isolation, an n-type region, and a p-type region are formed. A first layer wiring which serves as a gate layer is formed thereover, and then a second wiring layer is further formed thereover.

A part of the first layer wiring is a Sig. 1 wiring 162 for supplying a signal Sig. 1, and another part thereof is a Sig. 2 wiring 163 for supplying a signal Sig. 2. A part of the second layer wiring is a VDD wiring 161 for supplying VDD, and a part thereof is an IN wiring 164 for inputting a signal IN. In FIG. 7A, positions of contact holes through which wirings are connected to the upper component are shown. Note that in a circuit using a single crystal semiconductor wafer, VSS may be supplied from the semiconductor wafer.

Figure 7B:
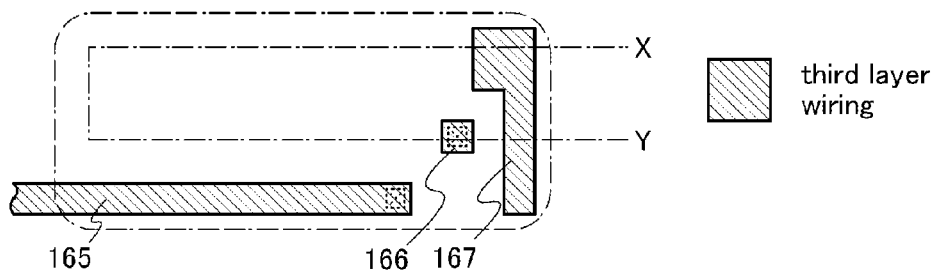

Further, as illustrated in FIG. 7B, a third layer wiring is provided over the structure of FIG. 7A, and a part of the third layer wiring is connected to a part of the second wiring layer through the contact hole, which serves as an OUT wiring 165 for outputting a signal OUT. The other parts of the third wiring layer functions as a drain electrode 166 and a source electrode 167 of a transistor as a switching element including an oxide semiconductor. The drain electrode 166 is connected to a part of the second layer wiring through the contact hole. The source electrode 167 serves as a part of an electrode of an element formed in a later step, which corresponds to the capacitor 105 in FIGS. 1A and 1B.

Figure 7C:
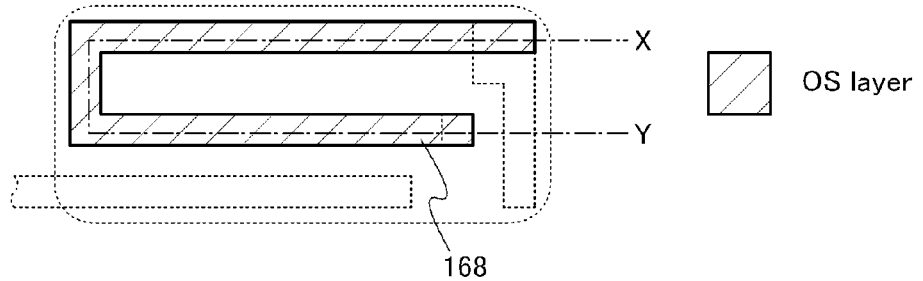

Over the third layer wiring, an oxide semiconductor layer (OS layer) is formed. As illustrated in FIG. 7C, the oxide semiconductor layer has at least one hollow portion when the oxide semiconductor layer is viewed in a direction perpendicular to its plain surface and thus has an oxide semiconductor region 168 with a U-shape, for example. Alternatively, the oxide semiconductor region 168 may have a J-shape, an L-shape, a V-shape, or a C-shape. Further alternatively, a shape having two or more hollow portions (e.g., an M-shape, an N-shape, an S-shape, a W-shape, a Z-shape, or the like), or a bent shape other than the above may be employed.

As a general definition, on the assumption that a typical length of one memory element is defined as the square root of the area of the memory element, the length from one end portion to the other end portion of the oxide semiconductor region 168 is greater than or equal to the typical length, preferably twice or more as large as the typical length, further preferably five times or more as large as the typical length. Alternatively, the length of the periphery of the oxide semiconductor region 168 is twice or more as large as the typical length, preferably four times or more as large as the typical length, further preferably ten times or more as large as the typical length.

Alternatively, a value obtained by dividing the area of the oxide semiconductor region 168 by the length of the periphery may be 0.1 times or less as large as the typical length.

With the above shape, the length from one end portion to the other end portion of the oxide semiconductor region 168 can be larger than the long side of the memory element 160. For example, given that the minimum feature size is F, the length from one end portion to the other end portion can be 10 F or more, preferably 20 F or more, further preferably 50 F or more. In a transistor (corresponding to the capacitor switching element 106 in FIGS. 1A and 1B) which is formed using the oxide semiconductor region 168 with the above shape, the channel length can be 10 F or more, preferably 20 F or more, further preferably 50 F or more. In the case of FIG. 7C, the length from one end portion to the other end portion of the oxide semiconductor region 168 is approximately 28 F.

Figure 7D:
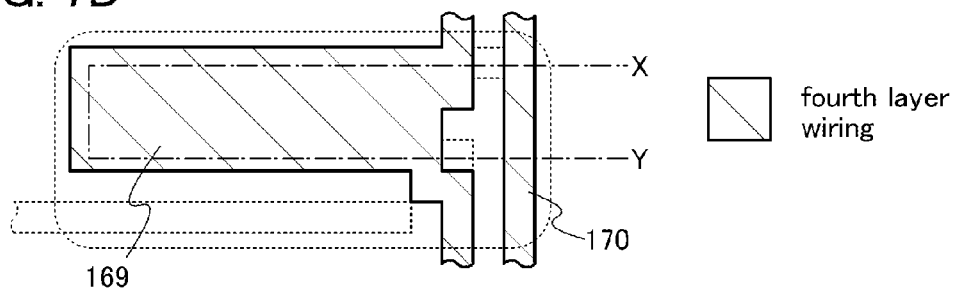

Over the oxide semiconductor layer, a fourth layer wiring is provided as illustrated in FIG. 7D. A gate wiring 169 and a capacitor wiring 170 are formed of the fourth layer wiring. The gate wiring 169 may be formed to overlap with an area greater than or equal to 80% of the oxide semiconductor region 168, preferably an area greater than or equal to 85% thereof, further preferably greater than or equal to 90% thereof. A part of the gate wiring 169 serves as a gate electrode of the capacitor switching element 106 illustrated in FIGS. 1A and 1B. Note that the signal Sig. 3 is supplied to the gate wiring 169. Further, the capacitor wiring 170 partly overlaps with the source electrode 167 to form a part of the capacitor 105 in FIGS. 1A and 1B. In the case of FIG. 7D, the area of electrodes of the capacitor (an area where two electrodes overlap with each other) is 8 $F^2$.

Figure 8A:
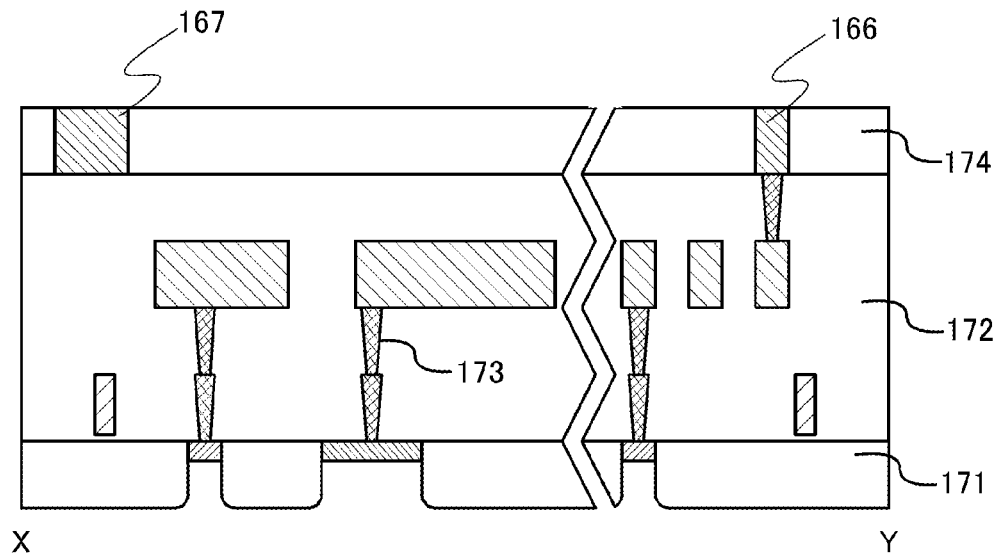
FIGS. 8A and 8B are cross-sectional views illustrating a structure of the memory element.
Figure 8B:
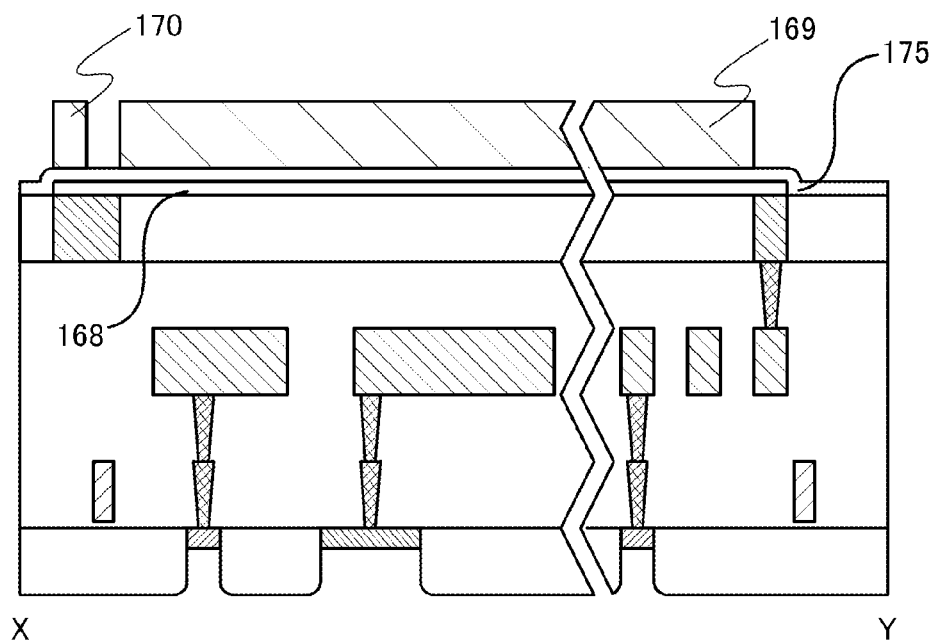

FIGS. 8A and 8B schematically illustrate a cross-sectional structure of the memory element 160 along dashed dotted line X-Y in FIGS. 7A to 7D. Note that in FIGS. 8A and 8B and FIGS. 7A to 7D, the same hatching denotes the same component.

FIG. 8A is a cross-sectional view of a structure in FIG. 7B. An STI 171, the n-type region, and the p-type region are formed in a surface layer on one surface of the semiconductor wafer, and the first layer wiring, and the second layer wiring are provided, so that a circuit is formed. An interlayer insulator 172 is provided over the n-type and p-type regions so that the first layer wiring and the second layer wiring are embedded. In the case where electrical connection between the n-type and p-type regions and the second layer wiring is needed, a contact plug 173 is provided. Further, over the interlayer insulator 172, the drain electrode 166 and the source electrode 167 formed of the third layer wiring are embedded in an embedding insulator 174.

FIG. 8B is a cross-sectional view of a structure in FIG. 7D. Over the structure illustrated in FIG. 8A, an oxide semiconductor layer (such as the oxide semiconductor region 168), a gate insulator 175, and the fourth layer wiring (the gate wiring 169 or the capacitor wiring 170) are further formed. Here, the thickness of the oxide semiconductor layer is 1 nm to 30 nm, preferably 1 nm to 10 nm, and the thickness of the gate insulator 175 is 2 nm to 30 nm, preferably 5 nm to 10 nm.

Further, as described in Patent Document 3, one or a plurality of materials with a high work function may be provided in contact with the oxide semiconductor layer. With such a structure, the oxide semiconductor layer can be depleted, which is effective in an increase in off-resistance.

In this embodiment, since quality of an oxide semiconductor layer is valued, a highly purified oxide semiconductor (film) may be used. A method for manufacturing such an oxide semiconductor (film) will be described in Embodiment 4.

Next, an example of operation of the memory element illustrated in FIG. 1A is described. Note that the operation of the memory element can be performed by a method other than the following description.

First, in writing data, the switching element 103 is turned on, the switching element 104 is turned off, and the capacitor switching element 106 is turned off. Then, the power supply potential VDD is supplied to the first node and the power supply potential VSS is supplied to the second node.

A potential of the signal N supplied to the memory element 100 is supplied to the input terminal of the first phase-inversion element 101 via the switching element 103, whereby the potential of the output terminal of the first phase-inversion element 101 is a phase-inverted potential of the signal N. Then, the switching element 104 is turned on and the input terminal of the first phase-inversion element 101 is connected to the output terminal of the second phase-inversion element 102, whereby data is written into the first phase-inversion element 101 and the second phase-inversion element 102.

Next, in the case where data is held by the first phase-inversion element 101 and the second phase-inversion element 102, in the state where the switching element 104 remains in an on state and the capacitor switching element 106 remains in an off state, the switching element 103 is turned off.

By turning off the switching element 103, the input data is held by the first phase-inversion element 101 and the second phase-inversion element 102. At this time, the power supply potential VDD is supplied to the first node and the power supply potential VSS is supplied to the second node, whereby the state in which the power supply voltage is applied between the first node and the second node is maintained.

The potential of the output terminal of the first phase-inversion element 101 reflects the data held by the first phase-inversion element 101 and the second phase-inversion element 102. Therefore, by reading out the potential, the data can be read out from the memory element 100.

Note that in the case where the input data is held by the capacitor 105 in order to reduce power consumption in holding the data, first, the switching element 103 is turned off, the switching element 104 remains in an on state, and the capacitor switching element 106 is turned on. Then, via the capacitor switching element 106, electric charge with an amount corresponding to the value of the data held by the first phase-inversion element 101 and the second phase-inversion element 102 is stored in the capacitor 105, whereby the data is written into the capacitor 105.

After the data is stored in the capacitor 105, the capacitor switching element 106 is turned off, whereby the data stored in the capacitor 105 is held. After the capacitor switching element 106 is turned off, for example, both the potential of the first node and the potential of the second node are set equal to each other, e.g., the power supply potential VSS. Note that after the data is stored in the capacitor 105, the switching element 104 may be turned off.

In such a manner, in the case where the input data is held by the capacitor 105, the application of the power supply voltage between the first node and the second node is unnecessary; therefore, the off-state current flowing between the first node and the second node via the p-channel transistor 107 and the n-channel transistor 108 which are included in the first phase-inversion element 101, or via the p-channel transistor 109 and the n-channel transistor 110 which are included in the second phase-inversion element 102 can be extremely close to zero.

As a result, power consumption due to the off-state current of the memory element in holding data can be significantly reduced, and accordingly the power consumption of the memory device and further the signal processing circuit including the memory device can be suppressed to be low.

Since the transistor used for the capacitor switching element 106 includes a highly-purified oxide semiconductor in a channel formation region, the off-state current density can be less than or equal to 100 zA/μm, preferably less than or equal to 10 zA/μm, further preferably less than or equal to 1 zA/μm.

In the case of a transistor with a long and narrow channel, the off-state current is less than or equal to 1 zA. As a result, when the capacitor switching element 106 for which the transistor is used is off, charge stored in the capacitor 105 is hardly released; therefore, the data is held.

In the case where the data stored in the capacitor 105 is read out, the switching element 103 is turned off. Then, the power supply potential VDD is again supplied to the first node and the power supply potential VSS is again supplied to the second node, whereby the power supply voltage is applied between the first node and the second node. Then, by turning on the capacitor switching element 106, the signal OUT having a potential that reflects the data can be read out from the memory element 100.

In the above description, an example of using a thin film transistor using a highly purified oxide semiconductor as the capacitor switching element 106 is described; however, a thin film transistor using amorphous silicon, polysilicon, microcrystalline silicon, or the like can be used.

In such a case, the amount of off-state current is increased as compared with that of a thin film transistor using a highly purified oxide semiconductor, and thus a time period during which data is held is short. However, an operation (refresh) in which data is regularly input/output into/from the first phase-inversion element 101 and the second phase-inversion element 102 and then the data is returned to the capacitor 105 is repeated, whereby holding data can be kept.

Note that in this case, refresh operations of all the memory elements which need to be refreshed can be conducted at the same time, which is different from refresh operation in a DRAM. Thus, time necessary for all the memory elements to perform refresh operation is extremely short as compared with the case in a DRAM. Needless to say, refresh operation may be sequentially performed per block including memory elements where refresh operation is needed.

Embodiment 2

Figure 4A:
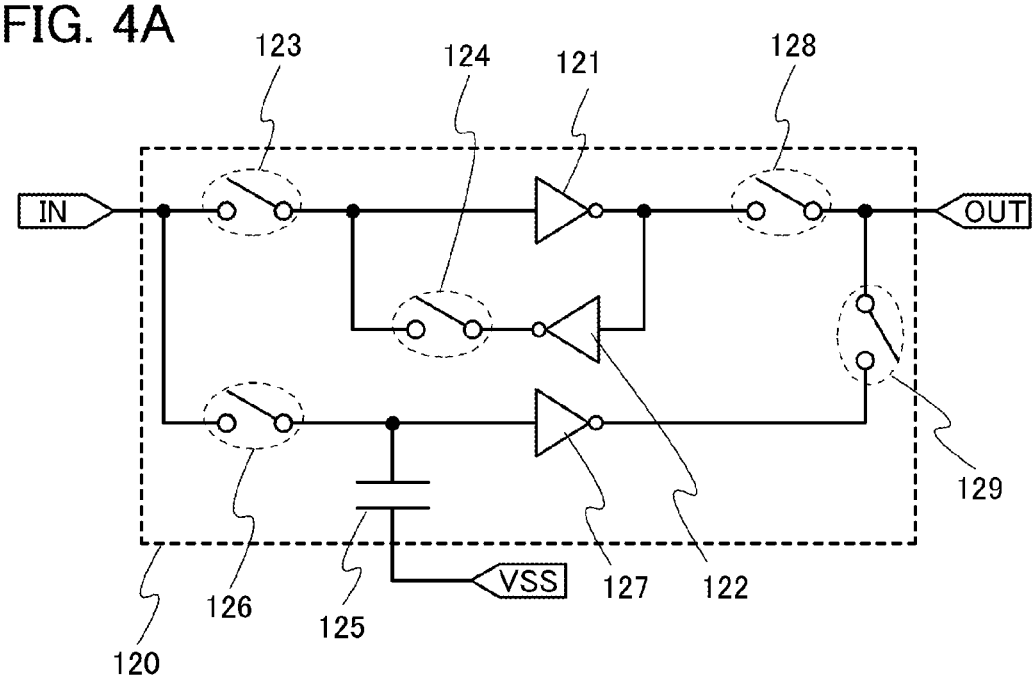
FIGS. 4A and 4B are circuit diagrams of a memory element.

In this embodiment, another example of a memory element included in a memory device of the present invention will be described. In FIG. 4A, a circuit diagram of the memory element of this embodiment is illustrated as an example.

A memory element 120 illustrated in FIG. 4A at least includes a first phase-inversion element 121, a second phase-inversion element 122, and a third phase-inversion element 127 by which the phase of an input signal is inverted and the signal is output, and a switching element 123, a switching element 124, a switching element 128, a switching element 129, a capacitor 125, and a capacitor switching element 126. Note that the switching element 128 is not necessarily provided.

A signal IN including data that is input to the memory element 120 is supplied to an input terminal of the first phase-inversion element 121 via the switching element 123. An output terminal of the first phase-inversion element 121 is connected to an input terminal of the second phase-inversion element 122. An output terminal of the second phase-inversion element 122 is connected to the input terminal of the first phase-inversion element 121 via the switching element 124. A potential of the output terminal of the first phase-inversion element 121 or a potential of the input terminal of the second phase-inversion element 122 is output as a signal OUT to a memory element or another circuit of a subsequent stage via the switching element 128.

The capacitor 125 is connected to an input terminal of the memory element 120, i.e., a node to which a potential of the signal IN is supplied, via the capacitor switching element 126 so that the data of the signal IN that is input to the memory element 120 can be stored as needed. Specifically, the capacitor 125 includes a dielectric between a pair of electrodes. One of the electrodes is connected to the node to which the potential of the signal IN is supplied via the capacitor switching element 126. The other of the electrodes is connected to a node to which a low-level power supply potential VSS or a fixed potential such as a ground potential is supplied.

In addition, the one of the electrodes of the capacitor 125 is connected to an input terminal of the third phase-inversion element 127. A potential of an output terminal of the third phase-inversion element 127 is output as a signal OUT via the switching element 129 to a memory element or another circuit of a subsequent stage.

Note that in FIG. 4A, an example in which inverters are used as the first phase-inversion element 121, the second phase-inversion element 122, and the third phase-inversion element 127 is illustrated; however, a clocked inverter can also be used as the first phase-inversion element 121, the second phase-inversion element 122, or the third phase-inversion element 127 besides the inverter.

For the capacitor switching element 126, a transistor including a highly purified oxide semiconductor in a channel formation region is used. Like the capacitor switching element 106 described in Embodiment 1, the capacitor switching element 126 is formed using an oxide semiconductor above the first phase-inversion element 121, the second phase-inversion element 122, and the third phase-inversion element 127, and the channel length thereof is greater than or equal to 10 F, preferably greater than or equal to 20 F, further preferably greater than or equal to 50 F.

Note that the memory element 120 may further include another circuit element such as a diode, a resistor, an inductor, or a capacitor, as needed.

Figure 5:
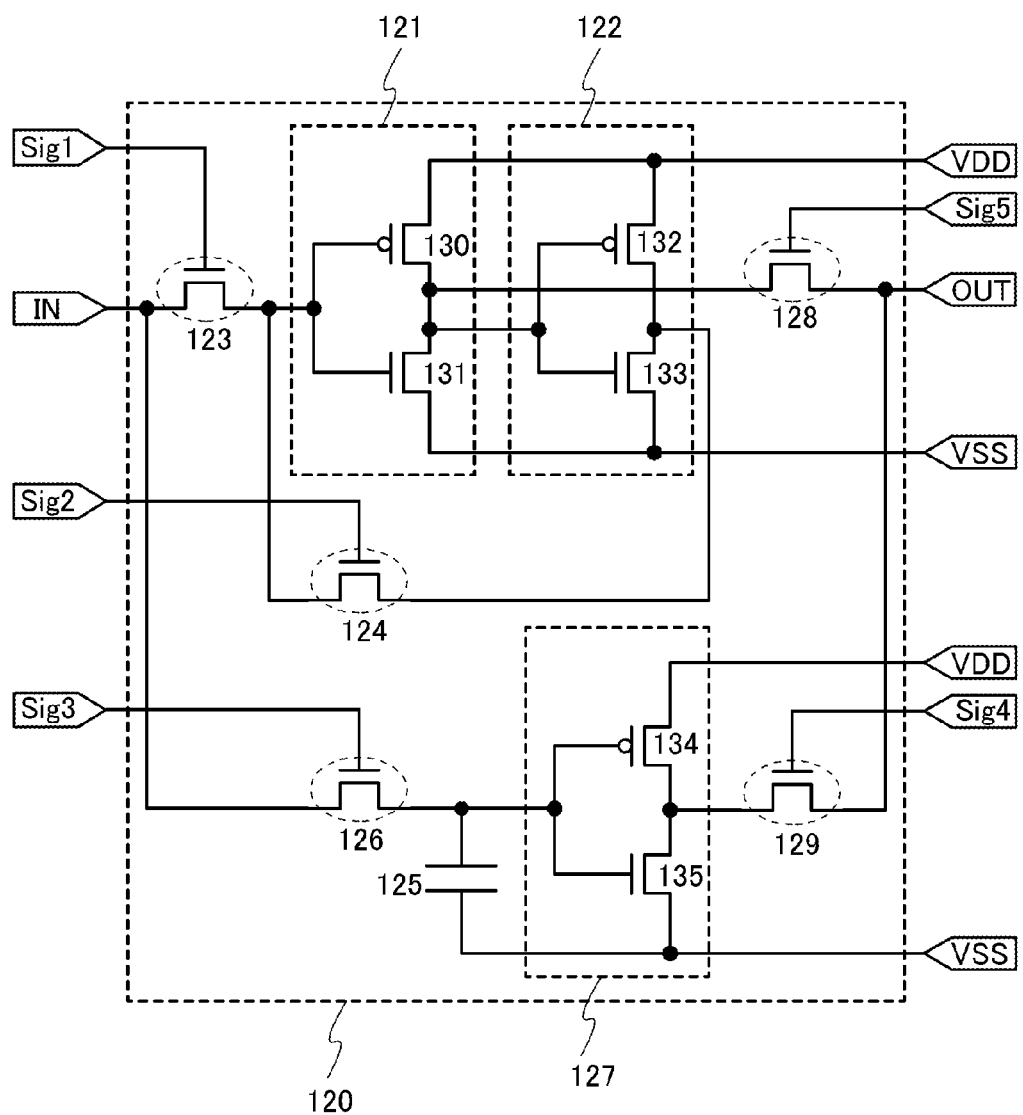
FIG. 5 is a circuit diagram of a memory element.

Next, an example of a more specific circuit diagram of the memory element in FIG. 4A is illustrated in FIG. 5. The memory element 120 illustrated in FIG. 5 at least includes the first phase-inversion element 121, the second phase-inversion element 122, the third phase-inversion element 127, the switching element 123, the switching element 124, the switching element 128, the switching element 129, the capacitor 125, and the capacitor switching element 126. The connection structure of these circuit elements are the same as that in FIG. 4A. Note that the switching element 123 is controlled by a signal Sig. 1, the switching element 124 is controlled by a signal Sig. 2, the switching element 128 is controlled by a signal Sig. 5, the switching element 129 is controlled by a signal Sig. 4, and the capacitor switching element 126 is controlled by a signal Sig. 3.

The first phase-inversion element 121 in FIG. 5 has a structure in which a p-channel transistor 130 and an n-channel transistor 131 whose gate electrodes are connected to each other are connected in series between a first node to which a high-level power supply potential VDD is supplied and a second node to which a low-level power supply potential VSS is supplied.

Specifically, a source electrode of the p-channel transistor 130 is connected to the first node to which the power supply potential VDD is supplied, and a source electrode of the n-channel transistor 131 is connected to the second node to which the power supply potential VSS is supplied.

In addition, a drain electrode of the p-channel transistor 130 is connected to a drain electrode of the n-channel transistor 131, and potentials of the two drain electrodes can be regarded as a potential of the output terminal of the first phase-inversion element 121.

In addition, potentials of the gate electrode of the p-channel transistor 130 and the gate electrode of the n-channel transistor 131 can be regarded as a potential of the input terminal of the first phase-inversion element 121.

The second phase-inversion element 122 in FIG. 5 has a structure in which a p-channel transistor 132 and an n-channel transistor 133 whose gate electrodes are connected to each other are connected in series between the first node to which the high-level power supply potential VDD is supplied and the second node to which the low-level power supply potential VSS is supplied.

Specifically, a source electrode of the p-channel transistor 132 is connected to the first node to which the power supply potential VDD is supplied, and a source electrode of the n-channel transistor 133 is connected to the second node to which the power supply potential VSS is supplied.

In addition, a drain electrode of the p-channel transistor 132 is connected to a drain electrode of the n-channel transistor 133, and potentials of the two drain electrodes can be regarded as a potential of the output terminal of the second phase-inversion element 122.

In addition, potentials of the gate electrode of the p-channel transistor 132 and the gate electrode of the n-channel transistor 133 can be regarded as a potential of the input terminal of the second phase-inversion element 122.

The third phase-inversion element 127 in FIG. 5 has a structure in which a p-channel transistor 134 and an n-channel transistor 135 whose gate electrodes are connected to each other are connected in series between a third node to which a high-level power supply potential VDD is supplied and a fourth node to which a low-level power supply potential VSS is supplied.

Specifically, a source electrode of the p-channel transistor 134 is connected to the third node to which the power supply potential VDD is supplied, and a source electrode of the n-channel transistor 135 is connected to the fourth node to which the power supply potential VSS is supplied.

In addition, a drain electrode of the p-channel transistor 134 is connected to a drain electrode of the n-channel transistor 135, and potentials of the two drain electrodes can be regarded as a potential of the output terminal of the third phase-inversion element 127.

In addition, potentials of the gate electrode of the p-channel transistor 134 and the gate electrode of the n-channel transistor 135 can be regarded as a potential of the input terminal of the third phase-inversion element 127.

Note that the first node and the third node may be electrically connected to each other as one node. Note also that the second node and the fourth node may be electrically connected to each other as one node.

In FIG. 5, the case where one transistor is used for the switching element 123 is illustrated as an example, and the switching of the transistor is controlled by the signal Sig. 1 supplied to a gate electrode thereof. In addition, the case where one transistor is used for the switching element 124 is illustrated as an example in FIG. 5, and the switching of the transistor is controlled by the signal Sig. 2 supplied to a gate electrode thereof. Further, the case where one transistor is used for the switching element 129 is illustrated as an example in FIG. 5, and the switching of the transistor is controlled by the signal Sig. 4 supplied to a gate electrode thereof.

Note that in FIG. 5, a structure in which each of the switching element 123, the switching element 124, and the switching element 129 includes only one transistor is illustrated; however, the present invention is not limited to this structure. In one embodiment of the present invention, the switching element 123, the switching element 124, or the switching element 129 may include a plurality of transistors.

In the case where a plurality of transistors which serve as switching elements are included in the switching element 123, the switching element 124, or the switching element 129, the plurality of transistors may be connected to each other in parallel, in series, or in combination of parallel connection and series connection.

In FIG. 5, a transistor including an oxide semiconductor in a channel formation region is used for the capacitor switching element 126, and the switching of the transistor is controlled by the signal Sig. 3 supplied to a gate electrode thereof.

Since the transistor used for the capacitor switching element 126 includes a highly purified oxide semiconductor in the channel formation region and has a sufficiently large channel length, the amount of off-state current is extremely small as described above.

Note that in FIG. 5, a structure in which the capacitor switching element 126 includes only one transistor is illustrated; however, the present invention is not limited to this structure. In one embodiment of the present invention, the capacitor switching element 126 may include a plurality of transistors.

In the case where a plurality of transistors which serve as switching elements are included in the capacitor switching element 126, the plurality of transistors may be connected to each other in parallel, in series, or in combination of parallel connection and series connection.

In one embodiment of the present invention, at least a transistor used for a switching element in the capacitor switching element 126 includes a compound semiconductor, e.g., a highly purified oxide semiconductor, in a channel formation region.

On the other hand, the transistors used for the first phase-inversion element 121, the second phase-inversion element 122, the third phase-inversion element 127, the switching element 123, the switching element 124, the switching element 128, and the switching element 129 can include an amorphous, microcrystalline, polycrystalline, or single crystal semiconductor. As a material of such a semiconductor, silicon or germanium can be given. In addition, for manufacturing such transistors, a thin semiconductor film or a bulk semiconductor may be used.

Next, an example of operation of the memory element illustrated in FIG. 4A is described. Note that the operation of the memory element can be performed by a method other than the following description.

First, in writing data, the switching element 123 is turned on, the switching element 124 is off, the switching element 128 is off, the switching element 129 is off, and the capacitor switching element 126 is turned on. Then, the power supply potential VDD is supplied to the first node and the power supply potential VSS is supplied to the second node, whereby a power supply voltage is applied between the first node and the second node.

A potential of the signal N supplied to the memory element 120 is supplied to the input terminal of the first phase-inversion element 121 via the switching element 123, whereby the potential of the output terminal of the first phase-inversion element 121 is a phase-inverted potential of the signal N. Then, the switching element 124 is turned on and the input terminal of the first phase-inversion element 121 is connected to the output terminal of the second phase-inversion element 122, whereby data is written into the first phase-inversion element 121 and the second phase-inversion element 122.

In writing the data, via the capacitor switching element 126, charge with an amount corresponding to the value of the data of the signal N is stored in the capacitor 125, whereby the data is written also into the capacitor 125.

Note that in writing the data, application of a power supply voltage between the third node and the fourth node is unnecessary. Therefore, for example, the power supply potential VSS is supplied to each of the third node and the fourth node so that the nodes have equal potentials.

Next, in order to hold the input data by the first phase-inversion element 121 and the second phase-inversion element 122, in the state where the switching element 124 remains in an on state, the switching element 128 remains in an off state, and the switching element 129 remains in an off state, the switching element 123 is turned off and the capacitor switching element 126 is turned off.

By turning off the switching element 123, the input data is held by the first phase-inversion element 121 and the second phase-inversion element 122. At this time, the power supply potential VDD is supplied to the first node and the power supply potential VSS is supplied to the second node, whereby the state in which the power supply voltage is applied between the first node and the second node is maintained.

In addition, by turning off the capacitor switching element 126, the data written into the capacitor 125 is also held.

The potential of the output terminal of the first phase-inversion element 121 reflects the data held by the first phase-inversion element 121 and the second phase-inversion element 122. Therefore, by reading out the potential by turning on the switching element 128, the data can be read out from the memory element 120.

Note that in order to reduce power consumption in holding data, in the case where the input data is held only in the capacitor 125, for example, the power supply potential VSS is supplied to each of the first node and the second node so that the nodes have equal potentials, and the application of the power supply voltage between the first node and the second node is stopped. When the application of the power supply voltage between the first node and the second node is stopped, the data held by the first phase-inversion element 121 and the second phase-inversion element 122 is erased, but the data written in the capacitor 125 is continuously held.

In such a manner, in the case where the input data is held in the capacitor 125, the application of the power supply voltage between the first node and the second node is unnecessary; therefore, the off-state current flowing between the first node and the second node via the p-channel transistor 130 and the n-channel transistor 131 which are included in the first phase-inversion element 121, or via the p-channel transistor 132 and the n-channel transistor 133 which are included in the second phase-inversion element 122 can be extremely close to zero.

As a result, power consumption due to the off-state current of the memory element in holding data can be significantly reduced, and the power consumption of the memory device and further the signal processing circuit including the memory device can be suppressed to be low.

In addition, in the case where the input data is held in the capacitor 125, the application of the power supply voltage between the third node and the fourth node is unnecessary. Therefore, the off-state current flowing between the third node and the fourth node via the p-channel transistor 134 and the n-channel transistor 135 which are included in the third phase-inversion element 127 can be extremely close to zero.

As a result, power consumption due to the off-state current of the memory element in holding data can be significantly reduced, and the power consumption of the memory device and further the signal processing circuit including the memory device can be suppressed to be low.

Since the transistor used for the capacitor switching element 126, for example, includes a highly purified oxide semiconductor in a channel formation region, the off-state current density can be less than or equal to 100 zA/μm, preferably less than or equal to 10 zA/μm, further preferably less than or equal to 1 zA/μm.

Accordingly, the transistor including the highly purified oxide semiconductor film as an active layer has an extremely smaller amount of off-state current than a transistor including silicon having crystallinity. As a result, when the capacitor switching element 126 for which the transistor is used is in an off state, charge stored in the capacitor 125 is hardly released; therefore, the data is held.

In the case where the data stored in the capacitor 125 is read out, the power supply potential VDD is supplied to the third node and the power supply potential VSS is supplied to the fourth node, whereby the power supply voltage is applied between the third node and the fourth node. When the power supply voltage is applied between the third node and the fourth node, the output terminal of the third phase-inversion element 127 is supplied with a phase-inverted potential of the potential of the input terminal thereof.

Note that the input terminal of the third phase-inversion element 127 is supplied with a potential having a level corresponding to the amount of charge stored in the capacitor 125; thus, a potential of the output terminal thereof reflects the data. Thus, by turning on the switching element 129, a signal OUT having a potential that reflects the data can be read out from the memory element 120.

In addition, one embodiment of the present invention is not limited to the above structure. In a manner similar to the memory element 100 illustrated in FIG. 1A, the capacitor 126 can be connected to an input terminal of the memory element 120, i.e., a node to which a potential of the signal IN is supplied, via the switching element 123. The connection structure of other circuit elements including a first phase-inversion element 121, a second phase-inversion element 122, and a third phase-inversion element 127, and a switching element 124, a switching element 128, a switching element 129, and a capacitor 125 is the same as that in FIG. 4A.

Note that in the case where the input data is held by the capacitor 125 in order to reduce power consumption in holding the data input to the first phase-inversion element 121 and the second phase-inversion element 122, first, the switching element 123 is turned off, the switching element 124 remains in an on state, the switching element 128 is turned off, the switching element 129 is turned off, and the capacitor switching element 126 is turned on. Then, via the capacitor switching element 126, electric charge with an amount corresponding to the value of the data held by the first phase-inversion element 121 and the second phase-inversion element 122 is stored in the capacitor 125, whereby the data is written into the capacitor 125.

After the data is stored in the capacitor 125, the capacitor switching element 126 is turned off, whereby the data stored in the capacitor 125 is held. After the capacitor switching element 126 is turned off, for example, both the potential of the first node and the potential of the second node are set equal to each other, e.g., the power supply potential VSS. Note that after the data is stored in the capacitor 125, the switching element 124 may be turned off.

In such a manner, in the case where the input data is held by the capacitor 125, the application of the power supply voltage between the first node and the second node is unnecessary; therefore, the off-state current flowing between the first node and the second node via the p-channel transistor 130 and the n-channel transistor 131 which are included in the first phase-inversion element 121, or via the p-channel transistor 132 and the n-channel transistor 133 which are included in the second phase-inversion element 122 can be extremely close to zero.

As a result, power consumption due to the off-state current of the memory element in holding data can be significantly reduced, and accordingly the power consumption of the memory device and further the signal processing circuit including the memory device can be suppressed to be low.

The matter disclosed in this embodiment can be implemented in appropriate combination with the matter described in the other embodiments.

Embodiment 3

Figure 4B:
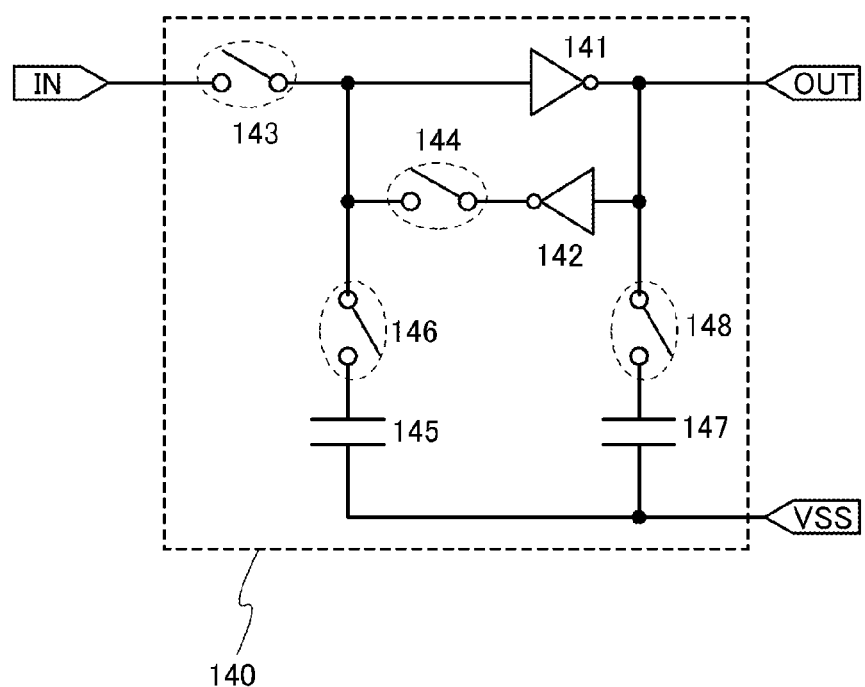

In this embodiment, another example of a memory element included in a memory device of the present invention will be described. In FIG. 4B, a circuit diagram of the memory element of this embodiment is illustrated as an example.

A memory element 140 illustrated in FIG. 4B at least includes a first phase-inversion element 141 and a second phase-inversion element 142 by which the phase of an input signal is inverted and the signal is output, a switching element 143, a switching element 144, a capacitor 145, a capacitor switching element 146, a capacitor 147, and a capacitor switching element 148.

A signal IN including data that is input to the memory element 140 is supplied to an input terminal of the first phase-inversion element 141 via the switching element 143. An output terminal of the first phase-inversion element 141 is connected to an input terminal of the second phase-inversion element 142. An output terminal of the second phase-inversion element 142 is connected to the input terminal of the first phase-inversion element 141 via the switching element 144. A potential of the output terminal of the first phase-inversion element 141 or a potential of the input terminal of the second phase-inversion element 142 is output as a signal OUT to a memory element or another circuit of a subsequent stage.

The capacitor 145 is connected to an input terminal of the memory element 140, i.e., a node to which a potential of the signal IN is supplied, via the switching element 143 and the capacitor switching element 146 so that the data of the signal IN that is input to the memory element 140 can be stored as needed. Specifically, the capacitor 145 includes a dielectric between a pair of electrodes. One of the electrodes is connected to the input terminal of the first phase-inversion element 141 via the capacitor switching element 146. The other of the electrodes is connected to a node to which a low-level power supply potential VSS or a fixed potential such as a ground potential is supplied.

In a manner similar to that of the capacitor 145, the capacitor 147 is connected to an output terminal of the memory element 140, i.e., a node to which a potential of a signal OUT is supplied, via the switching element 143, the first phase-inversion element 141, and the capacitor switching element 148 so that the data of the signal IN input to the memory element 140 can be stored as needed.

Specifically, the capacitor 147 includes a dielectric between a pair of electrodes. One of the electrodes is connected to the output terminal of the first phase-inversion element 141 via the capacitor switching element 148. The other of the electrodes is connected to the node to which the low-level power supply potential VSS or the fixed potential such as a ground potential is supplied.

Note that in FIG. 4B, an example in which inverters are used as the first phase-inversion element 141 and the second phase-inversion element 142 is illustrated; however, a clocked inverter can also be used as the first phase-inversion element 141 or the second phase-inversion element 142, besides the inverter.

For each of the capacitor switching element 146 and the capacitor switching element 148, a transistor including a highly purified oxide semiconductor in a channel formation region is used. Like the capacitor switching element 106 described in Embodiment 1, each of the capacitor switching element 146 and the capacitor switching element 148 is formed using an oxide semiconductor above the first phase-inversion element 141 and the second phase-inversion element 142, and each of the channel lengths thereof is greater than or equal to 10 F, preferably greater than or equal to 20 F, further preferably greater than or equal to 50 F.

Note that the memory element 140 may further include another circuit element such as a diode, a resistor, an inductor, or a capacitor, as needed.

Figure 6:
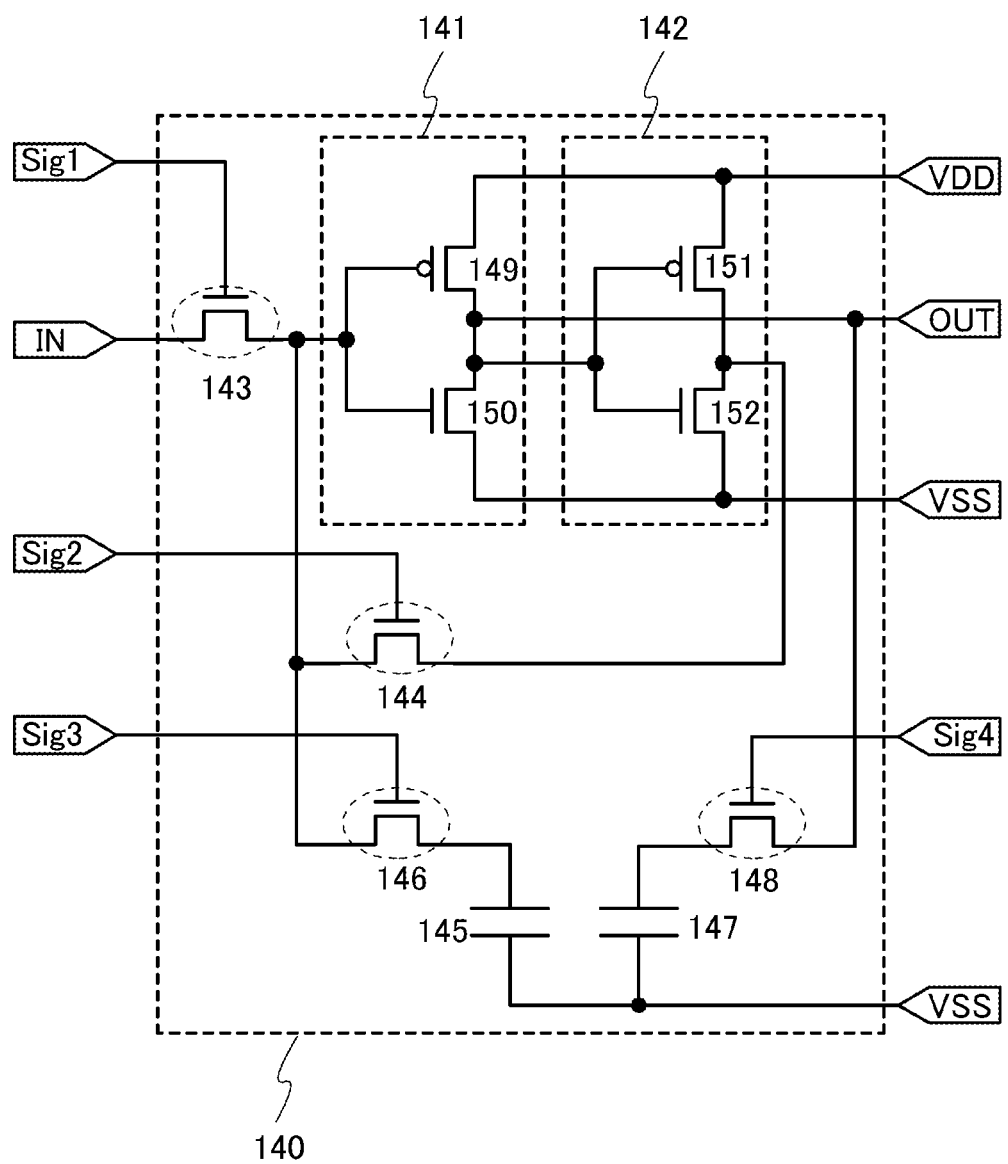
FIG. 6 is a circuit diagram of a memory element.

Next, an example of a more specific circuit diagram of the memory element in FIG. 4B is illustrated in FIG. 6. The memory element 140 illustrated in FIG. 6 at least includes the first phase-inversion element 141, the second phase-inversion element 142, the switching element 143, the switching element 144, the capacitor 145, the capacitor switching element 146, the capacitor 147, and the capacitor switching element 148. The connection structure of these circuit elements are the same as that in FIG. 4B.

The first phase-inversion element 141 in FIG. 6 has a structure in which a p-channel transistor 149 and an n-channel transistor 150 whose gate electrodes are connected to each other are connected in series between a first node to which a high-level power supply potential VDD is supplied and a second node to which a low-level power supply potential VSS is supplied.

Specifically, a source electrode of the p-channel transistor 149 is connected to the first node to which the power supply potential VDD is supplied, and a source electrode of the n-channel transistor 150 is connected to the second node to which the power supply potential VSS is supplied.

In addition, a drain electrode of the p-channel transistor 149 is connected to a drain electrode of the n-channel transistor 150, and potentials of the two drain electrodes can be regarded as a potential of the output terminal of the first phase-inversion element 141.

In addition, potentials of the gate electrode of the p-channel transistor 149 and the gate electrode of the n-channel transistor 150 can be regarded as a potential of the input terminal of the first phase-inversion element 141.

The second phase-inversion element 142 in FIG. 6 has a structure in which a p-channel transistor 151 and an n-channel transistor 152 whose gate electrodes are connected to each other are connected in series between the first node to which the high-level power supply potential VDD is supplied and the second node to which the low-level power supply potential VSS is supplied.

Specifically, a source electrode of the p-channel transistor 151 is connected to the first node to which the power supply potential VDD is supplied, and a source electrode of the n-channel transistor 152 is connected to the second node to which the power supply potential VSS is supplied.

In addition, a drain electrode of the p-channel transistor 151 is connected to a drain electrode of the n-channel transistor 152, and potentials of the two drain electrodes can be regarded as a potential of the output terminal of the second phase-inversion element 142.

In addition, potentials of the gate electrode of the p-channel transistor 151 and the gate electrode of the n-channel transistor 152 can be regarded as a potential of the input terminal of the second phase-inversion element 142.

In FIG. 6, the case where a transistor is used for the switching element 143 is illustrated as an example, and the switching of the transistor is controlled by a signal Sig. 1 supplied to a gate electrode thereof. In addition, the case where a transistor is used for the switching element 144 is illustrated as an example, and the switching of the transistor is controlled by a signal Sig. 2 supplied to a gate electrode thereof.

Note that in FIG. 6, a structure in which each of the switching element 143 and the switching element 144 includes only one transistor is illustrated; however, the present invention is not limited to this structure. In one embodiment of the present invention, the switching element 143 or the switching element 144 may include a plurality of transistors.

In the case where a plurality of transistors which serve as switching elements are included in the switching element 143 or the switching element 144, the plurality of transistors may be connected to each other in parallel, in series, or in combination of parallel connection and series connection.

In FIG. 6, a transistor including an oxide semiconductor in a channel formation region is used for the capacitor switching element 146, and the switching of the transistor is controlled by a signal Sig. 3 supplied to a gate electrode thereof. Since the transistor used for the capacitor switching element 146 includes a highly purified oxide semiconductor in a channel formation region and has a sufficiently large channel length, the amount of off-state current thereof is extremely small as described above.

In FIG. 6, a transistor including an oxide semiconductor in a channel formation region is used for the capacitor switching element 148, and the switching of the transistor is controlled by a signal Sig. 4 supplied to a gate electrode thereof. Since the transistor used for the capacitor switching element 148 includes a highly purified oxide semiconductor in a channel formation region and has a sufficiently large channel length, the amount of off-state current is extremely small as described above.

Note that in FIG. 6, a structure in which the capacitor switching element 146 or the capacitor switching element 148 includes only one transistor is illustrated; however, the present invention is not limited to this structure. In one embodiment of the present invention, the capacitor switching element 146 or the capacitor switching element 148 may include a plurality of transistors.

In the case where a plurality of transistors which serve as switching elements are included in the capacitor switching element 146 or the capacitor switching element 148, the plurality of transistors may be connected to each other in parallel, in series, or in combination of parallel connection and series connection.

In this embodiment, at least a transistor used for a switching element in the capacitor switching element 146 or the capacitor switching element 148 may include a compound semiconductor, e.g., a highly purified oxide semiconductor, in a channel formation region.

On the other hand, each of the transistors used for the first phase-inversion element 141, the second phase-inversion element 142, the switching element 143, and the switching element 144 can include a semiconductor other than an oxide semiconductor, such as amorphous silicon, microcrystalline silicon, polycrystalline silicon, single crystal silicon, amorphous germanium, microcrystalline germanium, polycrystalline germanium, or signal crystal germanium. In addition, for manufacturing the above-described transistor, a thin semiconductor film or a bulk semiconductor may be used.

Next, an example of the operation of the memory element illustrated in FIG. 4B or FIG. 6 is described. Note that the operation of the memory element can be performed by a method other than the following description.

First, in writing data, the switching element 143 is turned on, the switching element 144 is off, the capacitor switching element 146 is off, and the capacitor switching element 148 is turned off. Then, the power supply potential VDD is supplied to the first node and the power supply potential VSS is supplied to the second node, whereby a power supply voltage is applied between the first node and the second node.

A potential of the signal N supplied to the memory element 140 is supplied to the input terminal of the first phase-inversion element 141 via the switching element 143, whereby the potential of the output terminal of the first phase-inversion element 141 is a phase-inverted potential of the signal N. Then, the switching element 144 is turned on and the input terminal of the first phase-inversion element 141 is connected to the output terminal of the second phase-inversion element 142, whereby data is written into the first phase-inversion element 141 and the second phase-inversion element 142.

Next, in the case where the input data is held by the first phase-inversion element 141 and the second phase-inversion element 142, in the state where the switching element 144 remains in an on state, the capacitor switching element 146 remains in an off state, and the capacitor switching element 148 remains in an off state, the switching element 143 is turned off. By turning off the switching element 143, the input data is held by the first phase-inversion element 141 and the second phase-inversion element 142.

At this time, the power supply potential VDD is supplied to the first node and the power supply potential VSS is supplied to the second node, whereby the state in which the power supply voltage is applied between the first node and the second node is maintained.

The potential of the output terminal of the first phase-inversion element 141 reflects the data held by the first phase-inversion element 141 and the second phase-inversion element 142. Therefore, by reading out the potential, the data can be read out from the memory element 140.

Note that in the case where the input data is held in the capacitor 145 and the capacitor 147 in order to reduce power consumption in holding data, the switching element 143 is turned off, the switching element 144 is turned on, the capacitor switching element 146 is turned on, and the capacitor switching element 148 is turned on.

Then, via the capacitor switching element 146, charge with an amount corresponding to the value of the data held by the first phase-inversion element 141 and the second phase-inversion element 142 is stored in the capacitor 145, whereby the data is written into the capacitor 145.

In addition, via the capacitor switching element 148, charge with an amount corresponding to the value of the data held by the first phase-inversion element 141 and the second phase-inversion element 142 is stored in the capacitor 147, whereby the data is written into the capacitor 147. Note that the polarity of a voltage between a pair of electrodes included in the capacitor 145 and the polarity of a voltage between a pair of electrodes included in the capacitor 147 are opposite to each other.

After the data is stored in the capacitor 145, the capacitor switching element 146 is turned off, whereby the data stored in the capacitor 145 is held. In addition, after the data is stored in the capacitor 147, the capacitor switching element 148 is turned off, whereby the data stored in the capacitor 147 is held.

After turning off the capacitor switching element 146 and the capacitor switching element 148, for example, the power supply potential VSS is supplied to each of the first node and the second node so that the nodes have equal potentials, and the application of the power supply voltage between the first node and the second node is stopped.

In such a manner, in the case where the input data is held in the capacitor 145 and the capacitor 147, the application of the power supply voltage between the first node and the second node is unnecessary; therefore, via the p-channel transistor 149 and the n-channel transistor 150 which are included in the first phase-inversion element 141, or via the p-channel transistor 151 and the n-channel transistor 152 which are included in the second phase-inversion element 142, the off-state current flowing between the first node and the second node can be extremely close to zero.

As a result, power consumption due to the off-state current of the memory element in holding data can be significantly reduced, and the power consumption of the memory device and further the signal processing circuit including the memory device can be suppressed to be low.

Since the transistor used for each of the capacitor switching element 146 and the capacitor switching element 148 includes a highly purified oxide semiconductor in a channel formation region, the off-state current density can be less than or equal to 100 zA/μm, preferably less than or equal to 10 zA/μm, further preferably less than or equal to 1 zA/μm.

As a result, when the capacitor switching element 146 for which the transistor is used is in an off state, charge stored in the capacitor 145 is hardly released; therefore, the data is held. In addition, when the capacitor switching element 148 for which the above transistor is used is in an off state, electric charge stored in the capacitor 147 is hardly released; therefore, the data is held.

In the case where the data stored in the capacitor 145 and the capacitor 147 is read out, the power supply potential VDD is supplied to the first node and the power supply potential VSS is supplied to the second node, whereby the power supply voltage is applied between the first node and the second node.

In this state, the capacitor switching element 146 is turned on. When the power supply voltage is applied between the first node and the second node, the output terminal of the first phase-reversing element 141 is supplied with a phase-inverted potential of the potential of the input terminal thereof. Note that the input terminal of the first phase-inversion element 141 is supplied with a potential having a level corresponding to the amount of charge stored in the capacitor 145; thus, a potential of the output terminal thereof reflects the data.

In addition, by turning on the capacitor switching element 148, a potential having a level corresponding to the amount of charge stored in the capacitor 147 is supplied to the output terminal of the first phase-inversion element 141. Thus, a signal OUT having a potential that reflects the data can be read out from the memory element 140.

The matter disclosed in this embodiment can be implemented in appropriate combination with the matter described in the other embodiments.

Embodiment 4

In this embodiment, a method for forming an oxide semiconductor film is described with reference to FIGS. 8A and 8B. An oxide semiconductor film is formed to have an appropriate thickness over the embedding insulator 174. The oxide semiconductor film can be formed by a sputtering method in a rare gas (typically, argon) atmosphere, an oxygen atmosphere, or an atmosphere including a mixture of a rare gas (for example, argon) and oxygen. For the oxide semiconductor film, the above-described oxide semiconductor can be used.

Note that before the oxide semiconductor film is deposited by a sputtering method, dust on a surface of the embedding insulator 174 is preferably removed by reverse sputtering in which an argon gas is introduced and plasma is generated. The reverse sputtering refers to a method in which, without application of voltage to a target side, an RF power source is used for application of voltage to a substrate side in an argon atmosphere and plasma is generated in the vicinity of the substrate to modify a surface. Note that instead of an argon atmosphere, a nitrogen atmosphere, a helium atmosphere, or the like may be used. Further, an argon atmosphere to which oxygen, nitrous oxide, or the like is added may be used. Further alternatively, an argon atmosphere to which chlorine, carbon tetrafluoride, or the like is added may be used.

In this embodiment, as the oxide semiconductor film, an In—Ga—Zn-based oxide non-single-crystal film with a thickness of 5 nm, which is obtained by a sputtering method using a metal oxide target containing indium (In), gallium (Ga), and zinc (Zn), is used. As the target, a metal oxide target with such a composition ratio of metal atoms that In:Ga:Zn=1:1:0.5, In:Ga:Zn=1:1:1, or In:Ga:Zn=1:1:2 can be used, for example.

In this embodiment, since crystallization is intentionally caused by performing heat treatment in a later step, it is preferable to use a metal oxide target by which crystallization is easily caused. The fill rate of the metal oxide target containing In, Ga, and Zn is higher than or equal to 90% and lower than or equal to 100%, and preferably higher than or equal to 95% and lower than or equal to 99.9%. When a metal oxide target having a high fill rate is used, the impurity concentration in an oxide semiconductor film to be formed can be low, so that a transistor with excellent electric characteristics or high reliability can be obtained.

The substrate is held in a treatment chamber kept under reduced pressure, a sputtering gas from which hydrogen and moisture are removed is introduced into the treatment chamber from which remaining moisture is being removed, and the oxide semiconductor film is formed over the insulating surface with use of a metal oxide as a target. The substrate temperature may be in the range from 100° C. to 600° C. inclusive, preferably 200° C. to 400° C. inclusive during the film formation. Film formation is performed while the substrate is heated, whereby the concentration of an impurity contained in the formed oxide semiconductor film can be low and crystallinity can be increased. Further, damage by the sputtering can be suppressed.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In a treatment chamber which is exhausted with the cryopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the treatment chamber can be low.

An example of the deposition condition is as follows: the distance between the substrate and the target is 170 mm, the pressure is 0.4 Pa, the electric power of the direct current (DC) power source is 0.5 kW, and the atmosphere is an oxygen atmosphere (the proportion of the oxygen flow rate is 100%). Note that a pulsed direct-current (DC) power source is preferable because powder substances (also referred to as particles) generated in film deposition can be reduced and the film thickness can be uniform. The preferable thickness of the oxide semiconductor film is from 1 nm to 30 nm inclusive. Since an appropriate thickness depends on an oxide semiconductor material used, the thickness can be determined as appropriate depending on the material.

In order to contain hydrogen, a hydroxyl group, and moisture as little as possible in the oxide semiconductor film, it is preferable that the substrate be preheated in a preheating chamber of a sputtering apparatus as pretreatment before formation of the oxide semiconductor film, so that impurities such as hydrogen or moisture attached on the substrate are discharged and eliminated. The temperature for the preheating is higher than or equal to 100° C. and lower than or equal to 600° C., preferably higher than or equal to 150° C. and lower than or equal to 300° C. As an evacuation unit provided in the preheating chamber, a cryopump is preferable. Note that this preheating treatment can be skipped.

Next, heat treatment is performed and crystals are grown from a surface of the oxide semiconductor film, so that an oxide semiconductor film at least part of which is crystallized or becomes single crystals is obtained. In the heat treatment, a temperature is higher than or equal to 450° C. and lower than or equal to 850° C., preferably higher than or equal to 600° C. and lower than or equal to 700° C. In addition, heating time is longer than or equal to 1 minute and shorter than or equal to 24 hours. The crystal layer grows from the surface to the inside portion and contains plate-shaped crystals whose average thickness is greater than or equal to 2 nm and less than or equal to 10 nm. Further, the crystal layer formed at the surface has an a-b plane parallel to the surface of the crystal layer and a c-axis alignment perpendicularly to the surface of the crystal layer. In this embodiment, the entire oxide semiconductor film may be crystallized (the crystals are also referred to as co-growing (CG) crystals) by the heat treatment.

Note that in the heat treatment, it is preferable that water, hydrogen, and the like be not contained in nitrogen, oxygen, or a rare gas such as helium, neon, or argon. In addition, it is preferable that the purity of nitrogen, oxygen, or a rare gas such as helium, neon, or argon which is introduced to the heat treatment apparatus be 6N (99.9999%) or more, further preferably 7N (99.99999%) or more (that is, the impurity concentration is 1 ppm or lower, further preferably 0.1 ppm or lower). Further, the heat treatment may be performed in a dry air atmosphere with an $H_2O$ concentration lower than or equal to 20 ppm. In this embodiment, heat treatment in a dry air atmosphere at 700° C. for 1 hour is performed.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, the heat treatment can employ GRTA, in which the substrate is transferred into an inert gas heated at a high temperature of 650° C. to 700° C., and heated for several minutes there, and then taken out from the inert gas. With GRTA, high-temperature heat treatment for a short period of time can be achieved.

Next, by a photolithography method, the oxide semiconductor film is processed into the shape described in Embodiment 1, whereby the oxide semiconductor region 168 is formed. Note that a resist mask used in this process may be formed by an inkjet method. Formation of the resist mask by an inkjet method needs no photomask; thus, manufacturing cost can be reduced.

The matter disclosed in this embodiment can be implemented in appropriate combination with the matter described in the other embodiments.

Embodiment 5

Figure 9A:
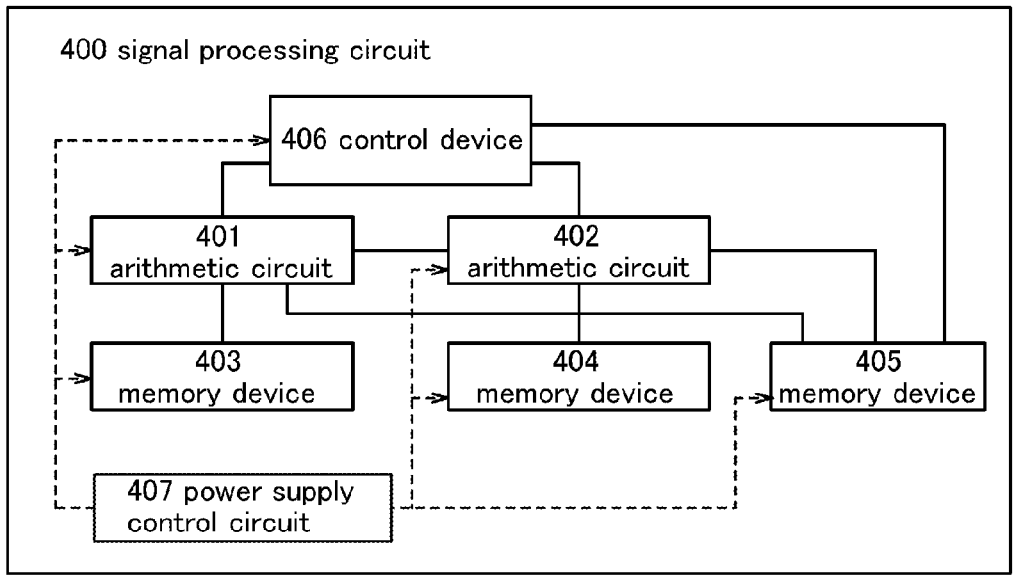
FIGS. 9A and 9B are block diagrams of a signal processing circuit and a CPU including a memory element.

FIG. 9A illustrates an example of a signal processing circuit according to one embodiment of the present invention, in which the memory element described in the above embodiment is used for a memory device. The signal processing circuit according to one embodiment of the present invention at least includes one or a plurality of arithmetic units and one or a plurality of memory devices. Specifically, a signal processing circuit 400 illustrated in FIG. 9A includes an arithmetic circuit 401, an arithmetic circuit 402, a memory device 403, a memory device 404, a memory device 405, a control device 406, and a power supply control circuit 407.

The arithmetic circuits 401 and 402 each include, as well as a logic circuit which carries out simple logic arithmetic processing, an adder, a multiplier, and various arithmetic units. The memory device 403 functions as a register for temporarily holding data when the arithmetic processing is carried out in the arithmetic circuit 401. The memory device 404 functions as a register for temporarily holding data when the arithmetic processing is carried out in the arithmetic circuit 402.

In addition, the memory device 405 can be used as a main memory and can store a program executed by the control device 406 as data or can store data from the arithmetic circuit 401 and the arithmetic circuit 402.

The control device 406 is a circuit which collectively controls operations of the arithmetic circuit 401, the arithmetic circuit 402, the memory device 403, the memory device 404, and the memory device 405 included in the signal processing circuit 400. Note that in FIG. 9A, the control device 406 is provided in the signal processing circuit 400 as a part thereof, but the control device 406 may be provided outside the signal processing circuit 400.

In the case where the memory element described in the above embodiment is used for at least one of the memory device 403, the memory device 404, and the memory device 405, data can be held even when supply of power supply voltage to the memory device 403, the memory device 404, and the memory device 405 is partly or completely stopped. In the above manner, the supply of the power supply voltage to the entire signal processing circuit 400 can be stopped partly or completely, whereby power consumption can be suppressed.

For example, the supply of the power supply voltage to one or more of the memory device 403, the memory device 404, and the memory device 405 is stopped, whereby power consumption can be suppressed. Alternatively, for example, in FIGS. 1A and 1B, supply of VDD or VSS to the memory element 100 is stopped and the signal Sig. 3 is set to the certain artificial potential (that is a potential lower than the ground potential by 0.5 V to 1.5 V), which is effective in reducing the power consumption.

When the signal Sig. 3 is set to the above potential, the current is considered to flow between the gate electrode and the oxide semiconductor region in the capacitor switching element 106; however, the value of the current is too small to be measured. That is, the current does not lead to power consumption. In contrast, when VDD or VSS is supplied to the memory element 100, the through current of the inverter is generated, and the considerable amount of power is accordingly consumed. Thus, stop of the supplying VDD and VSS produces a great effect of reducing power consumption.

In addition, as well as the supply of the power supply voltage to the memory device, the supply of the power supply voltage to the control circuit or the arithmetic circuit which transmits/receives data to/from the memory device may be stopped. For example, when the arithmetic circuit 401 and the memory device 403 are not operated, the supply of the power supply voltage to the arithmetic circuit 401 and the memory device 403 may be stopped.

In addition, the power supply control circuit 407 controls the level of the power supply voltage which is supplied to the arithmetic circuit 401, the arithmetic circuit 402, the memory device 403, the memory device 404, the memory device 405, and the control device 406 included in the signal processing circuit 400. As described above, the power supply control circuit controls VDD, VSS, and a potential of signal Sig. 3 as needed, and thus, consumed power can be reduced in a most effectively manner.

When the supply of the power supply voltage is stopped, the supply of the power supply voltage to the power supply control circuit 407 may be stopped, or the supply of the power supply voltage to the arithmetic circuit 401, the arithmetic circuit 402, the memory device 403, the memory device 404, the memory device 405, and the control device 406 may be stopped.

That is, a switching element for stopping the supply of the power supply voltage may be provided for the power supply control circuit 407, or each of the arithmetic circuit 401, the arithmetic circuit 402, the memory device 403, the memory device 404, the memory device 405, and the control device 406. In the latter case, the power supply control circuit 407 is not necessarily provided in the signal processing circuit according to the present invention.

A memory device which functions as a cache memory may be provided between the memory device 405 that is a main memory and each of the arithmetic circuit 401, the arithmetic circuit 402, and the control device 406. By providing the cache memory, low-speed access to the main memory can be reduced and the speed of the signal processing such as arithmetic processing can be higher. By applying the above-described memory element also to the memory device functioning as a cache memory, power consumption of the signal processing circuit 400 can be suppressed.

Embodiment 6

In this embodiment, a configuration of a CPU, which is one of signal processing circuits according to one embodiment of the present invention, will be described.

Figure 9B:
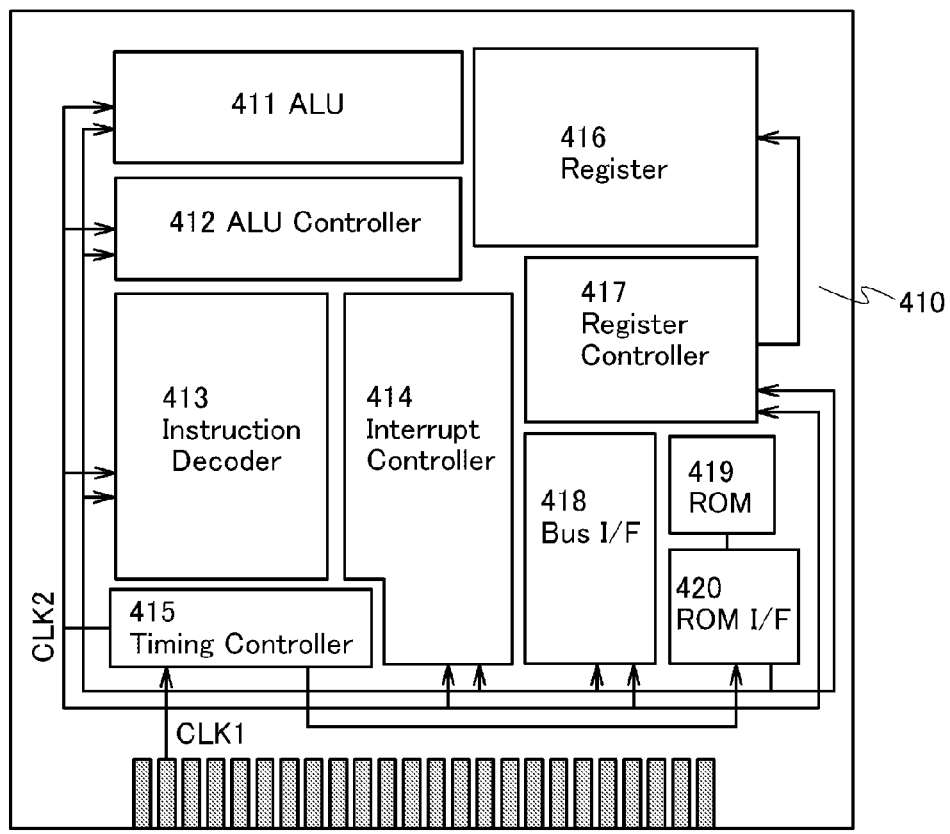

FIG. 9B illustrates a configuration of a CPU in this embodiment. The CPU illustrated in FIG. 9B mainly includes an arithmetic logic unit (ALU) 411, an ALU controller 412, an instruction decoder 413, an interrupt controller 414, a timing controller 415, a register 416, a register controller 417, a bus interface (Bus I/F) 418, a rewritable ROM 419, and a ROM interface (ROM I/F) 420, over a substrate 410.

The ROM 419 and the ROM interface 420 may be provided over another chip. Naturally, the CPU illustrated in FIG. 9B is only an example with a simplified configuration, and various configurations can be applied to an actual CPU depending on the application.

An instruction input to the CPU via the Bus I/F 418 is input to the instruction decoder 413 and decoded therein, and then input to the ALU controller 412, the interrupt controller 414, the register controller 417, and the timing controller 415.

In accordance with the decoded instruction, the ALU controller 412, the interrupt controller 414, the register controller 417, and the timing controller 415 conduct various controls. Specifically, the ALU controller 412 generates a signal for controlling operation of the ALU 411. While the CPU is executing a program, the interrupt controller 414 judges an interrupt request from an external input/output device or a peripheral circuit on the basis of its priority or a mask state, and processes the request. The register controller 417 generates an address of the register 416 and reads/writes data from/to the register 416 in accordance with the state of the CPU.

Further, the timing controller 415 generates a signal for controlling a timing of operation of the ALU 411, the ALU controller 412, the instruction decoder 413, the interrupt controller 414, and the register controller 417. For example, the timing controller 415 includes an internal clock generator for generating an internal clock signal CLK2 based on a reference clock signal CLK1, and supplies the clock signal CLK2 to the above circuits.

In the CPU in this embodiment, the register 416 may include a memory element with the above structure described in the above embodiment. The register controller 417 selects operation of holding data in the register 416 in accordance with the ALU 411. That is, the register controller 417 determines whether data is held by a phase-inversion element or by a capacitor in the memory element included in the register 416.

When data holding by the phase-inversion element is selected, power supply voltage is supplied to the memory element in the register 416. When data holding by the capacitor is selected, the data is rewritten in the capacitor, and supply of power supply voltage to the memory element in the register 416 can be stopped.

In such a manner, even in the case where the operation of the CPU is temporarily stopped and the supply of the power supply voltage is stopped, data can be held and the consumed power can be reduced. Specifically, for example, while a user of a personal computer does not input data to an input device such as a keyboard, the operation of the CPU can be stopped, so that the consumed power can be reduced.

Although the CPU is given as an example in this embodiment, the signal processing circuit of the present invention, without limitation to the CPU, can be applied to an LSI such as a DSP, a custom LSI, or a field programmable gate array (FPGA). With use of a signal processing circuit described in the present invention, a highly reliable electronic device and an electronic device with low power consumption can be provided.

In particular, when to a portable electronic device which has difficulty in continuously receiving power from an external device, a signal processing circuit with low power consumption according to one embodiment of the present invention is added as a component of the device, an advantage in increasing the continuous operation time can be obtained.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images).

Other than the above, as an electronic device which can be provided with the signal processing circuit according to one embodiment of the present invention, mobile phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

This application is based on Japanese Patent Application serial no. 2011-085995 filed with Japan Patent Office on Apr. 8, 2011, the entire contents of which are hereby incorporated by reference.

What is claimed is:

1. A memory element comprising:
    a first inverter;
    a second inverter;
    a first capacitor comprising a first electrode and a second electrode;
    a first transistor;
    a second transistor; and
    a second capacitor,
    wherein an output terminal of the first inverter is electrically connected to an input terminal of the second inverter,
    wherein an output terminal of the second inverter is electrically connected to an input terminal of the first inverter,
    wherein one of a source and a drain region of the first transistor is electrically connected to the input terminal of the first inverter,
    wherein the other of the source and the drain region of the first transistor is electrically connected to the first electrode of the first capacitor,
    wherein the first transistor includes a first semiconductor region with at least one hollow portion in a first channel formation region,
    wherein the first transistor controls writing of data to the first capacitor,
    wherein one of a source and a drain region of the second transistor is electrically connected to the input terminal of the second inverter, and
    wherein the other of the source and the drain region of the second transistor is electrically connected to the second capacitor.

2. The memory element according to claim 1, wherein a channel length of the first transistor is ten times or more as large as the minimum feature size.

3. The memory element according to claim 1, wherein a channel length of the first transistor is ten times or more as large as a channel width.

4. The memory element according to claim 1, wherein a channel length of the first transistor is greater than or equal to 1 μm.

5. The memory element according to claim 1, further comprising a third inverter,
    wherein the first electrode of the first capacitor is electrically connected to an input terminal of the third inverter, and
    wherein an output terminal of the third inverter is electrically connected to the input terminal of the second inverter.

6. The memory element according to claim 1, wherein the first semiconductor region includes an In—Ga—Zn-based oxide semiconductor.

7. The memory element according to claim 1, wherein a hydrogen concentration of the first channel formation region is lower than or equal to $5\times10^{19}/cm^3$.

8. The memory element according to claim 1, wherein the second transistor includes a second semiconductor region with at least one hollow portion in a second channel formation region.

9. The memory element according to claim 8, wherein the second semiconductor region includes an In—Ga—Zn-based oxide semiconductor.

10. The memory element according to claim 8, wherein a hydrogen concentration of the second channel formation region is lower than or equal to $5\times10^{19}/cm^3$.

11. A signal processing circuit comprising:
    an arithmetic circuit; and
    a memory device storing data output from the arithmetic circuit,
    wherein the memory device includes the memory element described in claim 1.

12. The signal processing circuit according to claim 11 is an LSI comprising a CPU, a DSP, or a microprocessor.

13. A memory element comprising:
    a first inverter;
    a second inverter;
    a first capacitor comprising a first electrode and a second electrode;
    a first transistor;
    a second transistor; and
    a second capacitor,
    wherein an output terminal of the first inverter is electrically connected to an input terminal of the second inverter,
    wherein an output terminal of the second inverter is electrically connected to an input terminal of the first inverter,
    wherein one of a source and a drain region of the first transistor is electrically connected to the input terminal of the first inverter,
    wherein the other of the source and the drain region of the first transistor is electrically connected to the first electrode of the first capacitor,
    wherein the first transistor is provided over at least one of the first and the second inverters and includes a first semiconductor region with at least one hollow portion in a first channel formation region,
    wherein the first transistor controls writing of data to the first capacitor,
    wherein one of a source and a drain region of the second transistor is electrically connected to the input terminal of the second inverter, and
    wherein the other of the source and the drain region of the second transistor is electrically connected to the second capacitor.

14. The memory element according to claim 13, wherein a channel length of the first transistor is ten times or more as large as the minimum feature size.

15. The memory element according to claim 13, wherein a channel length of the first transistor is ten times or more as large as a channel width.

16. The memory element according to claim 13, wherein a channel length of the first transistor is greater than or equal to 1 μm.

17. The memory element according to claim 13, further comprising a third inverter,
    wherein the first electrode of the first capacitor is electrically connected to an input terminal of the third inverter, and
    wherein an output terminal of the third inverter is electrically connected to the input terminal of the second inverter.

18. The memory element according to claim 13, wherein the first semiconductor region includes an In—Ga—Zn-based oxide semiconductor.

19. The memory element according to claim 13, wherein a hydrogen concentration of the first channel formation region is lower than or equal to $5 \times 10^{19}/cm^3$.

20. The memory element according to claim 13, wherein the second transistor includes a second semiconductor region with at least one hollow portion in a second channel formation region.

21. The memory element according to claim 20, wherein the second semiconductor region includes an In—Ga—Zn-based oxide semiconductor.

22. The memory element according to claim 20, wherein a hydrogen concentration of the second channel formation region is lower than or equal to $5 \times 10^{19}/cm^3$.

23. A signal processing circuit comprising:
   an arithmetic circuit; and
   a memory device storing data output from the arithmetic circuit,
   wherein the memory device includes the memory element described in claim 13.

24. The signal processing circuit according to claim 23 is an LSI comprising a CPU, a DSP, or a microprocessor.

* * * * *